United States Patent [19]

Sedberry

[11] Patent Number: 5,317,342
[45] Date of Patent: May 31, 1994

[54] HIGH-DENSITY PRINT HEAD

[75] Inventor: Donald C. Sedberry, Gwynedd, Pa.

[73] Assignee: Max Levy Autograph, Inc., Philadelphia, Pa.

[21] Appl. No.: 928,352

[22] Filed: Aug. 12, 1992

Related U.S. Application Data

[62] Division of Ser. No. 408,529, Sep. 18, 1989, which is a division of Ser. No. 141,113, Jan. 5, 1988, Pat. No. 4,897,676.

[51] Int. Cl.⁵ .................................................. B41J 2/325
[52] U.S. Cl. ........................... 346/76 PH; 346/155; 346/139 C
[58] Field of Search .............. 346/76 PH, 155, 139 C

[56] References Cited

U.S. PATENT DOCUMENTS

| | | | |
|---|---|---|---|
| 2,932,710 | 4/1960 | Coale | 346/155 |
| 4,076,575 | 2/1978 | Chang | 346/155 |
| 4,289,364 | 9/1981 | Strom | 346/155 |
| 4,289,802 | 9/1981 | Micheli | 346/155 |
| 4,298,786 | 11/1981 | Marciniec | 346/155 |
| 4,304,624 | 12/1981 | Carson | 346/155 |
| 4,312,897 | 1/1982 | Reimann | 346/155 |
| 4,339,305 | 7/1982 | Jones | 346/155 |
| 4,344,817 | 8/1982 | Chamberlin | 346/155 |
| 4,386,116 | 5/1983 | Nair | 346/155 |
| 4,391,849 | 7/1983 | Bischoff | 346/155 |
| 4,399,348 | 8/1983 | Bakewell | 346/76 PH |
| 4,415,403 | 11/1983 | Bakewell | 346/155 |
| 4,439,270 | 3/1984 | Powell | 346/155 |
| 4,454,014 | 6/1984 | Bischoff | 346/155 |
| 4,454,167 | 6/1984 | Berndt | 346/155 |
| 4,502,917 | 3/1985 | Chamberlin | 346/155 |
| 4,508,753 | 4/1985 | Stepan | 346/155 |
| 4,508,754 | 4/1985 | Stepan | 346/155 |
| 4,534,814 | 8/1985 | Volpe et al. | 346/76 PH |
| 4,552,615 | 11/1985 | Amendola | 346/155 |
| 4,566,940 | 1/1986 | Itsumi | 346/155 |
| 4,569,902 | 2/1986 | Saito | 346/155 |
| 4,574,094 | 3/1986 | DeLuca | 346/155 |
| 4,581,098 | 4/1986 | Gregor | 346/155 |
| 4,601,777 | 7/1986 | Hawkins | 346/155 |
| 4,604,298 | 8/1986 | Shevtchuk | 346/155 |
| 4,606,787 | 8/1986 | Pelligrino | 346/155 |
| 4,606,788 | 8/1986 | Moran | 346/155 |
| 4,609,427 | 9/1986 | Inamoto | 346/155 |
| 4,612,083 | 9/1986 | Yasumoto | 346/155 |
| 4,614,563 | 9/1986 | Kubo | 346/155 |
| 4,617,193 | 10/1986 | Wu | 346/155 |
| 4,622,058 | 11/1986 | Leary-Renick | 346/155 |
| 4,623,556 | 11/1986 | Brown | 346/155 |
| 4,636,811 | 1/1987 | Bakewell | 346/76 PH |
| 4,636,812 | 1/1987 | Bakewell | 346/76 PH |
| 4,651,168 | 3/1987 | Terajima et al. | 346/76 PH |
| 4,657,778 | 4/1987 | Moran | 346/155 |
| 4,670,091 | 6/1987 | Thomas | 346/155 |
| 4,672,737 | 6/1987 | Carson | 346/155 |
| 4,679,054 | 7/1987 | Yoshikawa et al. | 346/76 PH |
| 4,681,656 | 7/1987 | Byrum | 346/155 |
| 4,685,998 | 8/1987 | Quinn | 346/155 |
| 4,690,833 | 9/1987 | Donson | 346/155 |
| 4,692,205 | 9/1987 | Sachdev | 346/155 |
| 4,698,125 | 10/1987 | Rhodes | 346/155 |

OTHER PUBLICATIONS

Bulletin 1100, Max Levy Autograph, Inc.
Bulletin 1800, Max Levy Autograph, Inc.
Catalog of Electro-Science Laboratories, Inc.
Mitchell et al., "Silicon-Based Printhead Design", IBM Disclosure Bulletin, vol. 22, No. 12, May 1980, pp. 5496–5498.

*Primary Examiner*—Benjamin R. Fuller
*Assistant Examiner*—Huan Tran
*Attorney, Agent, or Firm*—William H. Eilberg

[57] ABSTRACT

The invention is a print head for a thermal or electrostatic printer, the print head being made from a high-density circuit. The high-density circuit includes conductors having a spacing less than about 0.005 inches, the conductors being disposed over a relatively large area. The circuit is defined by a pattern of grooves in a dielectric substrate, and a conductive material is deposited in the grooves, and heated so as to form a tight bond with the substrate. The resulting circuit is stable, rugged, and capable of producing an image of high resolution. The invention also includes a print head made from a multi-layered version of the circuit. The invention permits the production of black and white or color halftone images having very large numbers of grey scale levels, and exceptional resolution.

15 Claims, 13 Drawing Sheets

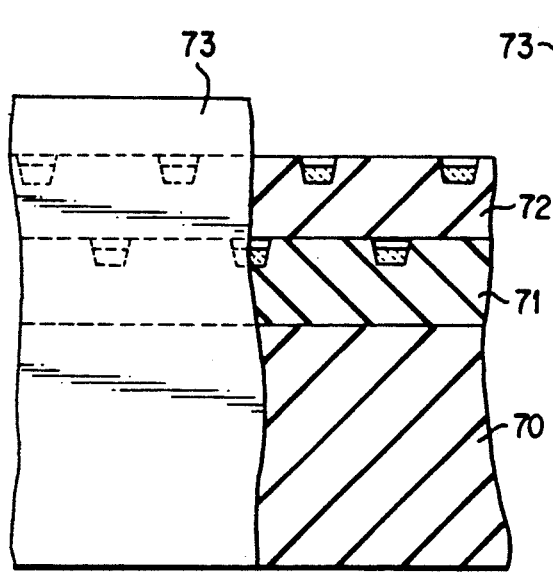
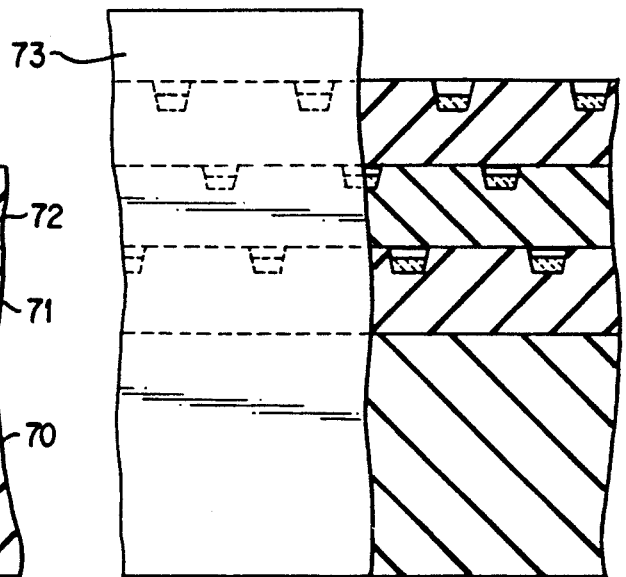
FIG.15  FIG. 16
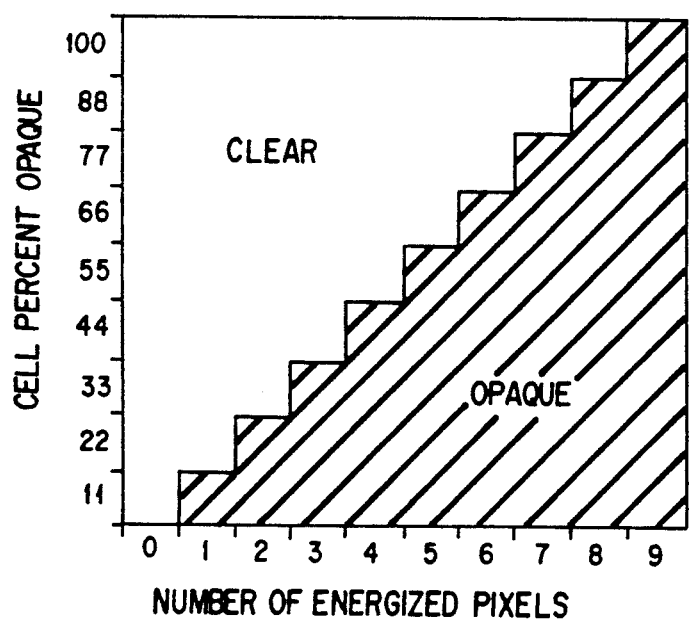
FIG. 18

HIGH-DENSITY PRINT HEAD

This is a division of application Ser. No. 07/408, 529, filed Sep. 18, 1989, which is a division of application Ser. No. 07/141,113, filed Jan. 5, 1988, now U.S. Pat. No. 4,897,676.

BACKGROUND OF THE INVENTION

This invention relates to the construction of high-density circuits, for use in various applications.

The circuits of the present invention are very stable, i.e. they are substantially unaffected by changes in temperature and humidity, and do not warp or change in size in any great degree. They are also highly resistant to corrosion. The circuits of the invention are also extremely rugged, resistant to abrasion, and resistant to long-term exposure to adverse environmental effects, such as extremes of temperature or humidity, vibration, salt, and other effects.

The conductors of the circuits in the present invention are extremely narrow and tightly-packed, yet they can carry relatively high voltages and/or currents. The conductors, and the spaces between them, are less than about 0.005 inches wide. The invention can therefore be used in the fabrication of ultra-high precision large linear circuit arrays for thermal or electrostatic print heads for generating high-resolution images. The invention can also be used to form print heads which produce black-and-white or color halftones.

Various methods have been proposed, in the prior art, for manufacturing high-density circuit. One early example is given in U.S. Pat. No. 2,932,710. The latter patent shows a technique for forming a plurality of metallic electrical conductors in an automobile window, for the purpose of heating (and defrosting) the window. The patent shows conductors having a spacing which ranges from about 50 to about 200 lines per inch, and having line widths of from 0.0001 to 0.002 inches. The conductive metal is silver, which is applied by coating the glass substrate with silver, or by an evaporation or vapor deposition technique.

In U.S. Pat. No. 4,604,298, a conductive material is squeezed through a fine screen, such as a molybdenum sheet which may be about 0.001 inches thick, and onto a substrate. The patent shows a method of producing conductors as narrow as 0.00175 inches, with a spacing of less than 0.005 inches. However, the patent states that the lengths of the circuit lines must be less than about 0.050 inches, in order to preserve the integrity of the molybdenum screen. The technique of the cited patent is difficult to control.

U.S. Pat. No. 4,574,094 discloses a method of placing a set of electric conductors on a ceramic material using a metalization technique. That is, a layer of conductive material, arranged in a suitable circuit pattern, is applied directly to a chemically-treated dielectric surface and fired, so that the conductive material binds to the dielectric. Although the width of the lines of the conductors can be as low as about 25 microns (less than 0.001 inches), the metallizing process has the disadvantage that it is difficult to form conductors having significant thickness (height). Metalization typically results in thicknesses of 2000–3000 Angstroms (about 0.000008 to about 0.000012 inches). With plating-up techniques, this thickness can sometimes be increased. However, with increased thickness, surface adhesion becomes a problem, due to stresses that build up during the metalization process, and these stresses are not easily overcome. These shortcomings limit the current-carrying capacity of the conductors. Since the circuit is on the surface, damage to the circuit lines is also a common problem, and extreme care must be exercised during fabrication and assembly.

U.S. Pat. Nos. 4,508,753 and 4,508,754 disclose methods of making fine-line circuits on an insulating substrate. The patents disclose circuits which are engraved in the substrate, but do not disclose how dense and how large these circuits may be.

U.S. Pat. No. 4,454,167 discloses another process for producing a high-density circuit on an insulating substrate. The method involves the use of photosensitive materials and metallic slurries to create fine line patterns. The circuit pattern is applied directly to the surface of the substrate.

Another method of applying a conductive material to a ceramic substrate involves the screening of the material onto the entire substrate surface, firing the substrate, and then selectively removing the unwanted material by photolithography, plasma or other etching techniques. In the case of photolithographic techniques, the tendency for the circuit path to separate from the substrate during processing is quite high. One cause of line breaks is from microscopic surface imperfections in the dielectric or conductive layers, and non-adhesion sites between the dielectric and conductive layers that allow the etchant to penetrate between the conductive layer and substrate dielectric by running under the fine-line circuit paths, from etched areas, and breaking the circuit from below. This problem becomes more critical as line widths decrease and the number of circuit lines increases. The state of the art is not sufficiently advanced in both design and economics to allow the use of plasma etching techniques to construct the large scale circuit arrays described in this invention.

U.S. Pat. No. 4,289,364 discloses a method of connecting a flexible circuit to a circuit which is etched in a glass substrate. The grooves in the glass are comparatively wide, of the order of about 0.032 inches.

Various means have also been used to generate images on paper and other media. A print head for a thermal printer includes resistive materials placed between circuit paths. The resistive materials are heated and brought in contact with the wax-coated printing paper or ribbon. U.S. Pat. No. 4,604,298 discusses the application of fine-line circuit construction to the fabrication of single-layer thermal print heads.

An electrostatic high-speed printer generates charged sites on a drum or belt, either by an optical scanning technique or by using a linear circuit array disposed near the drum or belt. It has been known to construct such linear circuit arrays using conventional printed circuit technology. These arrays suffer from a very high reject rate and nonlinearity of the pixel array due to the imprecise methodology and materials of construction. They also do not have the operating temperature range, mechanical stability, or ruggedness of this invention.

All of the printer or image-generation devices described above seek to produce a very uniform and precise pixel format with as many pixels per inch as possible. The human eye is a very good image integrator and can detect extremely small differences in a closely spaced pixel array or closely spaced series of lines. The eye can detect these differences, even though individual pixels or lines cannot be resolved. This is the basic reason that the so-called halftone technology has been so successful for the printing of photographic images with inks.

In the case of thermal printers, a ceramic substrate with a dielectric coating, and a fired-on conductive pattern, comprises the linear array. As mentioned above, U.S. Pat. No. 4,604,298 discusses the application of high-density circuit construction to the manufacture of thermal print heads. But a thermal print head made according to the method of the latter patent has the disadvantage that its conductors are limited in length to about 0.050 inches. Also, the length of the circuit is subject to variation due to the stretching of the screen. Adhesion to the substrate, and uniformity of circuit thickness and width, are highly dependent on the viscosity of the conductive material, the thickness of the mask, and operator technique.

Printing heads are also fabricated from copper-clad circuit board materials, in which case the one makes the circuit board with the print head array lines in the center of the board, with a pixel density onehalf that of the finished print head. The board is then fabricated using conventional photolithographic and printed circuit etching techniques. It may also be plated up to increase the circuit thickness or aspect ratio. The board is then sliced in half along its center, and the two halves are placed either face-to-face, with a thin dielectric separator to prevent shorts, or back-to-back. By offsetting the boards, the desired array density is achieved. Arrays having conductor widths of 0.003 inches, with densities of up to 240 lines per inch, have been produced by this general method. These arrays suffer from a very high reject rate and non-linearity of the print head array, due to the imprecise methodology and materials of construction. These circuits also do not have the operating temperature range, mechanical stability, or ruggedness of the present invention.

SUMMARY OF THE INVENTION

The present invention, in its most basic form, is a high-density electric circuit, formed on an insulating substrate, and a method of its manufacture. The circuit includes fine-line conductors, having widths in the range of about 0.0005 to about 0.005 inches, and having spacings in this same range. The circuit is large; that is, it is formed over areas of at least about one square inch, and can be formed over areas exceeding one square foot. Typically, each square inch of the circuit may include at least 100 inches in total circuit length. The circuit can be formed in virtually any pattern, subject to the guidelines mentioned above. The circuit can be formed with varying densities; the circuit is intended to have a density of at least 100 lines per inch, but it is preferred that the density be much greater.

The circuit of the present invention can be made in one layer, or it can be formed with multiple layers. The invention includes a process for forming a multi-layer circuit.

According to the invention, one forms the circuit by coating an insulating substrate, such as glass or a dielectric-coated ceramic material, with a metal. Then one applies a uniform layer of photoresist, over the metallic layer. The photoresist is exposed through a pattern representing the desired circuit, and, after development, the photoresist disappears in those locations where a circuit conductor is wanted. Next, one etches the underlying metallic layer, in those locations, where the metal is exposed. One further etches into the substrate, in those same locations. The remaining photoresist and metallic layers are stripped away, and the resulting grooves in the substrate are filled with a conducting material capable of withstanding high firing temperatures. The material is fired, so that the result is a circuit having conductors embedded in an insulating substrate.

The invention also includes specific processes for preparing the substrate, and for bonding the conducting material onto the substrate. The substrate is prepared by grinding and polishing the material until it has a specified degree of flatness. The substrate is cleaned and then coated with a layer of dielectric material. The dielectric is fired in a kiln, using a time-temperature profile which is such that the temperature is first maintained at a level sufficient to allow impurities in the dielectric to burn off, and is then maintained at a higher temperature, sufficient to allow the dielectric to flow freely, and to form a smooth, level surface.

The substrate is then coated with a material that will resist etchants, preferably a metallic substance. The substrate is then coated with a photoresist, baked, and exposed to light, through a mask which contains the desired circuit pattern. The photoresist is developed, and the metallic coating is etched away from the circuit paths. Then, the dielectric coating is itself etched. Thus, the circuit pattern becomes etched into the dielectric. The photoresist and the metallic coating are stripped away, and the etched grooves are filled with the material to be used as the conductors of the circuit. The latter material is preferably a "cermet", i.e. a conductive material which can be fired, like ceramics, at high temperatures. The substrate is fired, and the cermet becomes firmly bonded to the substrate, within each of the grooves.

The invention also includes methods for making circuits having more than one layer, and for making single-layer circuits wherein the connections to external electronic components are taken from two different layers. In general, in the latter case, the layers are formed with precisely registered holes extending through the dielectric, and cermet material placed in these holes forms the electrical connection from one layer to the next.

The invention also includes print heads for printing devices, the print heads employing the circuits described above, for generating highquality images. The circuit of the present invention can place conductors extremely close together, and these conductors can be used to form images, using the technology of electrostatic or thermal printing. The print heads of the present invention are intended to be capable of printing at least 100 lines per inch, with a minimum cell density of 10000 cells per square inch. In the preferred embodiment, these minimum specifications are easily exceeded.

The invention also includes methods of designing a print head capable of forming high quality color images, and/or black and white half-tone images using many levels of grey scale. By correctly controlling the voltages on each of the conductors in the print head, one can also compensate for the Moiré effect, in color printing, by varying the angle of inclination of each pixel of the image, depending on the color of the pixel. Such precise control of the image has not been possible with the print heads of the prior art, due to their coarse pixel array and thus their limited resolution.

It is therefore an object of the invention to provide a high-density circuit.

It is another object to provide a high-density circuit which is large, very stable, rugged, resistant to abrasion and to environmental stress, and capable of carrying high voltages and/or high currents.

It is another object to provide a high-density circuit which can be formed in single or multiple layers.

It is another object to provide a method of making the high-density circuit described above.

It is another object to provide print heads, using the high-density circuit described above, for the production of images having high resolution.

It is another object to provide tooling, and a method of making such tooling, for the fabrication of the high-density circuits described above.

It is another object to provide a high-density circuit having line widths or line spaces as narrow as about 0.0005 inches.

It is another object to provide a print head, using the above-described circuit, capable of producing an image having a pixel density of up to 1000 lines per inch, and wherein the print head can comprise a long array, of the order of 17 inches or more.

It is another object to provide a print head capable of producing single and multi-color halftone images, the print head having the characteristics described above.

It is another object to provide a method of designing an electrostatic or thermal print head, capable of forming multicolor images and/or black and white halftone images having very finely varying grey scales.

It is another object to provide a method of designing an electrostatic or thermal print head, for printing of color images, wherein the print head can reduce or eliminate the Moiré effect due to interference from different colors.

Other objects and advantages of the invention will be apparent to those skilled in the art, from a reading of the following brief description of the drawings, the detailed description of the invention, and the appended claims.

BRIEF DESCRIPTION OF THE DRAWINGS

FIG. 15 is an end view of a print head for a thermal printer, the figure showing the resistive bar partly broken away, the print head being made from a two-layer circuit according to the present invention.

FIG. 16 is an end view of a print head for a thermal printer, the figure showing the resistive bar partly broken away, the print head being made from a three-layer circuit according to the present invention.

FIG. 18 is a graph showing the percentage of opaque area, in a cell of the image, as a function of the number of pixels present in that cell.

DETAILED DESCRIPTION OF THE INVENTION

Figure 1:
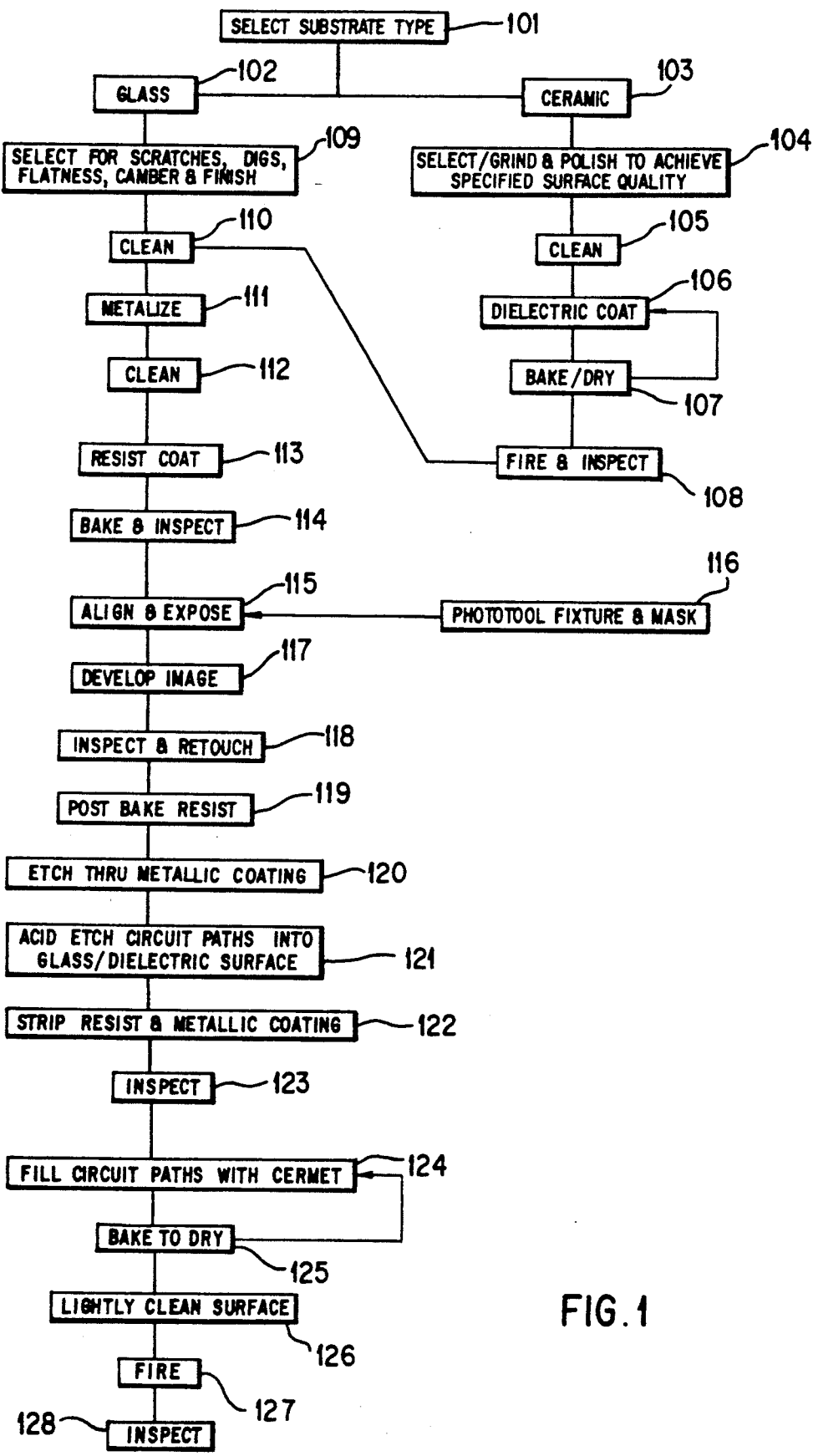
FIG. 1 is a flow chart describing the process steps for constructing a single-layer high-density circuit according to the invention.

FIG. 1 gives an overview of the process for making a single-layer high-density circuit according to the present invention. This figure will be described first, and then the details of the process will be explained.

The first step is the selection of a substrate, made in block 101. The substrate is either glass, indicated in block 102, or ceramic, indicated in block 103. If the substrate is ceramic, it is first ground and polished to achieve the desired surface quality, in block 104, then cleaned in block 105. The substrate is coated with dielectric in block 106, and baked in block 107, the latter two steps being performed more than once, if necessary. The substrate is fired and inspected, in block 108.

If the substrate is glass, it is chosen for the desired surface qualities, in block 109.

For either type of substrate, the process continues in block 110, where the substrate is cleaned. The substrate is coated with a layer, preferably of metal, in block 111, and cleaned again in block 112. The latter two steps may be repeated. The substrate is then coated with photoresist (block 113), and baked and inspected (block 114).

The substrate is then inserted into an alignment fixture and exposed, in block 115, using a phototool made by a known process, in block 116. The image of the circuit is developed, in block 117, inspected in block 118, and post-baked in block 119. Then, in block 120, an etchant is applied, to etch through the metallic coating, and, in block 121, another etchant forms the circuit paths as grooves in the glass or dielectric material. The remaining photoresist and metallic coating is removed, in block 122, and the product is inspected in block 123. The grooves, which will comprise the circuit paths, are filled with conductive material, such as a "cermet", described below, in block 124, and the product is baked in block 125. The latter two steps may be repeated. The surface is cleaned, in block 126, and then fired, in block 127. The finished product is inspected, in block 128.

The details of the process summarized above can now be described.

First, as stated above, it is necessary to begin with a substrate that has been specially prepared to enhance surface flatness, and to minimize scratches, digs, and inclusions, i.e. internal defects that may lie just below the surface. Military Specification MIL-0-13830 describes the standards required for scratches and digs. The substrate used in the present invention must meet or exceed the latter specification.

The choice of material used as the substrate depends on the firing temperature of the conductive material, which in turn depends on the resistivity of the conductive material. In the present invention, the conductive material is preferably a substance known as a "cermet", which is a material that is conductive and also capable of being fired at a high temperature, like a ceramic.

In many cases, the cermet used as the conductor material has a comparatively high resistivity and a relatively low firing temperature, and in such cases, soda lime glass can safely be used as the substrate. An example of such a cermet is the material sold by Electro-Science Laboratories, Inc., of King of Prussia, Pa., as Product No. 9595-B. The latter material fires at about 475°–500° C.

On the other hand, if the conductors are intended to carry more current, with low losses, and therefore must be of lower resistivity, then cermets which fire at higher temperatures must be used. In this case, one uses a ceramic substrate, such as the 96% alumina ceramic substrate produced by Kyrocera Corporation of Japan, coated with a dielectric layer. The cermet can be one such as Product No. 5837 or 8880-H, of Electro-Science Laboratories, Inc., which fire in the range of about 850°–1000° C. The choice of ceramic material is not critical; the above-mentioned ceramic is intended to be exemplary and not limiting.

If the circuit is to have lines as narrow as 0.0005 inches, the substrate must be very flat, having a deviation of no more than about 5 microns per inch, and must have a camber of no more than about 0.002 inches per 11 inches. The scratch/dig specification in the portion of the surface of the substrate where the high-density circuit lines are formed should be of the order of 20/1 (using the terminology of Military Specification MIL-0-13830) for line widths of 0.0005, and 40/5 for 0.003 inch line widths. In the case of glass substrates, these specifications can be achieved by selecting the proper material, and/or by grinding and polishing the substrate.

As indicated in the chart of FIG. 1, in the case of ceramic substrates, special processing is needed to achieve the necessary surface quality. A process for preparing the ceramic substrate is as follows. First, the commercially available ceramic substrate is ground and polished to a flatness of 5 microns per inch, a camber of 0.002 inches per 12 inches of length, and a surface finish of 20 microinches or better. Some scratches, digs, and inclusions are acceptable, as long as they do not exceed about 0.001 inches in depth. For double-sided circuitry, both sides of the ceramic substrate are processed to these specifications.

Next, the side coated with the dielectric is cleaned with detergent, dried, and then cleaned with acetone. Other cleaners may be used as long as they remove the metallic and organic contaminants from the surface to be coated with the dielectric.

Next, a first layer of dielectric material, such as Product No. 4903-H, of Electro-Science Laboratories, Inc., is screened or sprayed onto the surface. Both electronic-grade dielectrics and commercial glazes have been successfully used in this step. In the case of the electronic-grade dielectrics, the material is dried by baking at a temperature necessary to set the surface for recoating. The required temperature has been found to be the range of 250°–300° F. The process is repeated a third time if it is desired to make the dielectric thickness, after firing, exceed 0.001 inches. In the case of commercial sprayed glazes, the number of glaze layers sprayed is also related to the desired thickness after firing. Commercial glazes may be air-dried between coatings, at room temperature, or heating may be used to accelerate the drying process. It is also possible to dip or spin coat the commercial glazes; however, care must be taken to prevent uneven surface thicknesses or "wedges" across the surface that will contain the fine-line circuitry. In all cases, the coatings should be applied in clean-room conditions to reduce surface contamination.

Figure 2:
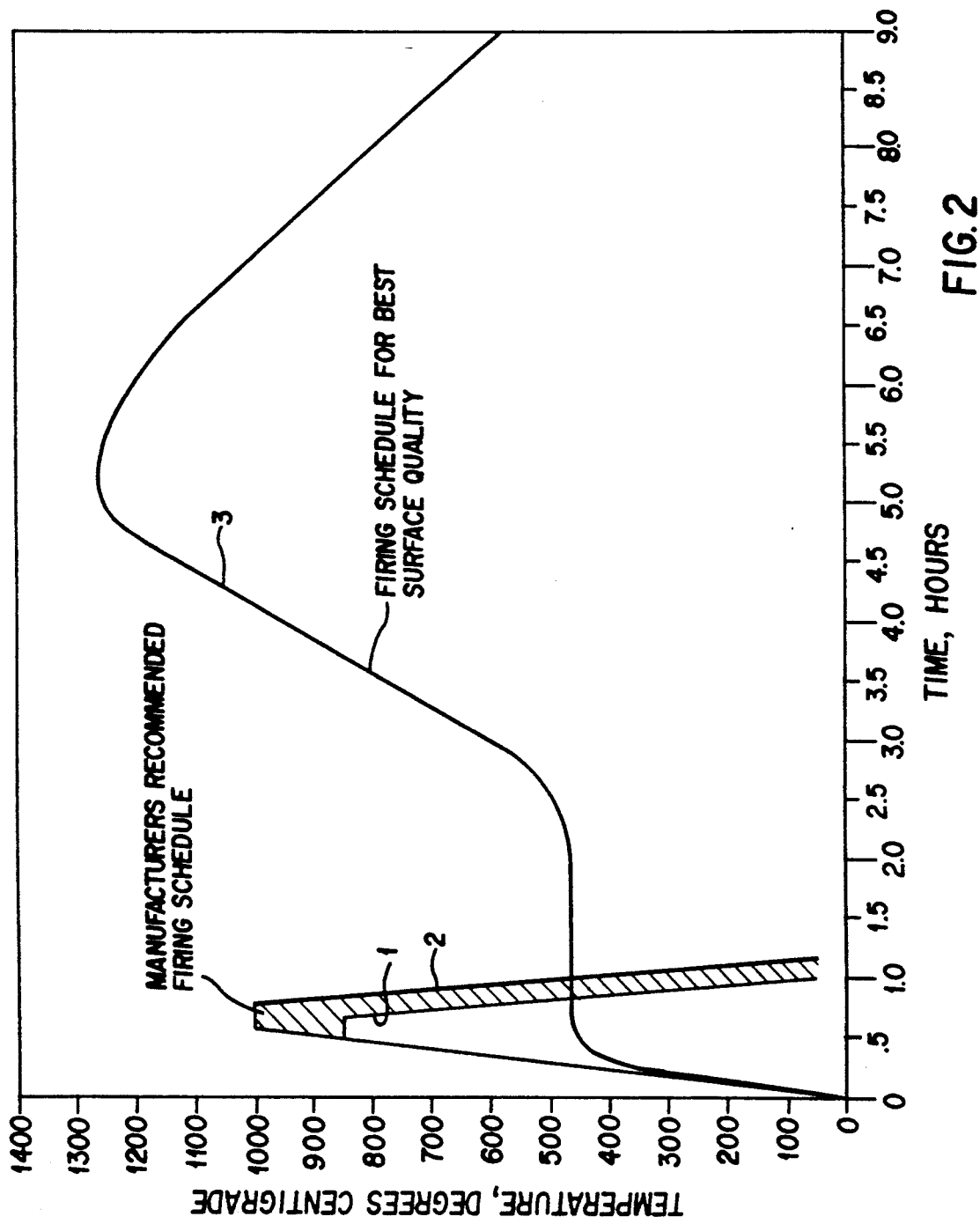
FIG. 2 is a graph showing a typical temperature/time profile of the firing of a dielectric, in preparing the dielectric for use in the present invention.

The glazed ceramic parts are then fired in a commercial kiln. Typical firing curves and temperatures recommended by the electronic-grade dielectric manufacturers were found to be unsatisfactory for producing the required defect-free surface finish. FIG. 2 compares the firing schedule used in the prior art, for a selected, screenable, electronicgrade dielectric, to the firing schedule developed as part of this invention. Curves 1 and 2, FIG. 2, define a range of typical prior art firing schedules. Curve 3 represents the firing schedule according to the present invention, for the specific dielectric indicated. The firing schedule would need to be modified for other dielectric materials.

The important features of the firing schedule, as illustrated by curve 3, are that the temperature is held at a level high enough (in this case, nearly 500° C.), and for a time long enough (in this case, over two hours) to drive off the impurities, including organic substances, that may be present in the dielectric. Then, the temperature is brought to a still higher temperature (in this case, over 1200° C.) sufficient to cause the material to flow freely. It is important to allow the material to flow, to eliminate residual patterns due to the screen, and to eliminate surface bubbles and pin holes. Also, note that the time spent at or above 1200° C. is more than about one hour. In general the required firing temperatures for the screenable, electronic-grade dielectrics are higher, the time at the maximum temperature is longer, and the ramp-up and cool-down time/temperature profiles are longer, compared with the firing schedules of the prior art.

For very thick dielectric layers, and/or double-sided circuits, the steps of applying the dielectric layer and firing it may be repeated. For double-sided circuits, edge fixturing or clear areas are required to allow for support of the substrate during firing. Both sides of a two-sided circuit can also be fired at the same time. In all cases, the substrate should be fired horizontally to prevent the dielectric from flowing unevenly and forming undesired regions of increased thickness.

When the above-described steps are completed, the result is an acceptably smooth substrate which can be used to construct the high-density circuit.

The next step in the circuit-fabrication process is to coat the substrate with a material that will resist etchants, the etchant being a substance such as buffered hydrofluoric acid. As suggested above, the coating is preferably metallic, but other materials can be used if they can resist the etchant, and if they can be deposited on the substrate in very thin layers. The coating can be evaporated or sputtered chromium, or a metal-based substance such as Product No. LC-102, available from Max Levy Autograph, Inc. The substrate must be properly cleaned with detergent and acetone, or other suitable cleaners, before being coated. It is preferable to apply the coating in two layers, with a cleaning step between each layer, to reduce the number of pinholes in the coating.

After the coating step, the substrate is inspected for surface defects and pinholes. If the coating is good, the substrate is then coated with a photoresist, and baked at a temperature in the range of 190°-220° F. It is preferable to apply the photoresist by dip coating or by spinning the substrate and applying drops of resist by centrifugal force. It is also preferred to use positive resists. The thickness of the photoresist coating, for fine-line work in the 5 to 50 micron region, is in the range of 1.5 microns. Care must be exercised to produce a uniform thickness of the photoresist layer. It is also possible to use negative film resists such as Riston, which is a solid-phase material available from the DuPont Company. However, fine-line replication with thicker-film photoresists is more difficult to achieve.

The resist-coated surface is then exposed through a mask which contains the desired circuit pattern. The circuit pattern includes the circuit lines themselves, and may also include pads, i.e. conductive lines of enlarged area, which are sized to permit connection of the circuit to the external components.

Production of a mask having very fine lines, over relatively long distances, such as 17 inches or greater, requires very stable and accurate tooling. Such tooling has been generated by the "Autograph Machine", owned by Max Levy Autograph, Inc. Only one such machine is known to exist, but the products of this machine are made available for sale by the owner.

The process for producing the mask for generating the high-density circuit, symbolized in block 116 of FIG. 1, is described in Bulletin 1100 and Bulletin 1800, of Max Levy Autograph, Inc. The latter publications are incorporated by reference herein. The Autograph Machine is used to draw a tooling master on double-layer, pin-hole free, chromiumcoated (or LC-102-coated) plates that have 1.5 microns of positive photoresist as the imaging medium. Line placement accuracy is better than 3 microns per 12×12 inches of imaged area. The average deviation from the desired position of a given line is better than 1.3 microns or 0.00005 inches. This tolerance is 1/10 of the smallest line width of 0.0005 inches described in this invention. The smallest line width currently generated on the Autograph Machine over large areas, without great difficulty, is 0.0002 inches.

The process for making the phototool (also designated as a "tool" or "mask") is essentially the same as shown and described in Bulletin 1100, and is described as follows. The Autograph Machine draws the image by directing a focused beam of light along the resist in the desired places. The photoresist is then developed, and baked at a temperature of 220°-260° F., to harden the resist, and to make it less susceptible to the etchant. The tool is inspected for defects, retouched as required to eliminate pin holes, and the metallic coating on the tool is etched away. For tooling using chromium as the master tool, the metallic coating is etched away, where the circuit paths are to be formed in the substrate, and the residual photoresist over the remaining chromium is stripped off. For tooling consisting of etched and epoxy-filled plates, the image is etched into the glass plate using buffered hydrofluoric acid, the photoresist and metallic coatings are stripped off, and the grooves in the plates are filled with black epoxy to form the circuit paths in the master tooling. For processing using negative photoresist to image the circuits on the substrates, the metallic coating is etched away from all areas, except the circuit paths, and the residual photoresist is stripped from the remaining chromium areas.

Thus, as shown in Bulletin 1100, cited above, the finished phototool has either lines of chromium, bonded to the substrate, or it has a substrate which is etched and filled with opaque epoxy.

The phototool is then set up with the required tooling pins and printing frame. The phototool, when properly registered, replicates, in the substrate, the fine, closely-spaced lines, over long lengths and areas, required for this invention.

Registration of the tooling to the substrate and subsequent exposure can be done with printing frame systems available from Max Levy Autograph, Inc., as described in the above-cited Bulletin 1800, or from other sources. Accurate registration of the phototool to the blank (i.e. the coated substrate) is accomplished by placing two tooling pins in the master or lower exposure plate, along the long edge, and one pin on the left or right-hand edge. The substrate is accurately cut and finished on these surfaces that touch the tooling pins. These edges are ground flat and perpendicular to the surface to be imaged. The substrate is pushed against these tooling pins with spring-loaded retaining pins.

Figure 3:
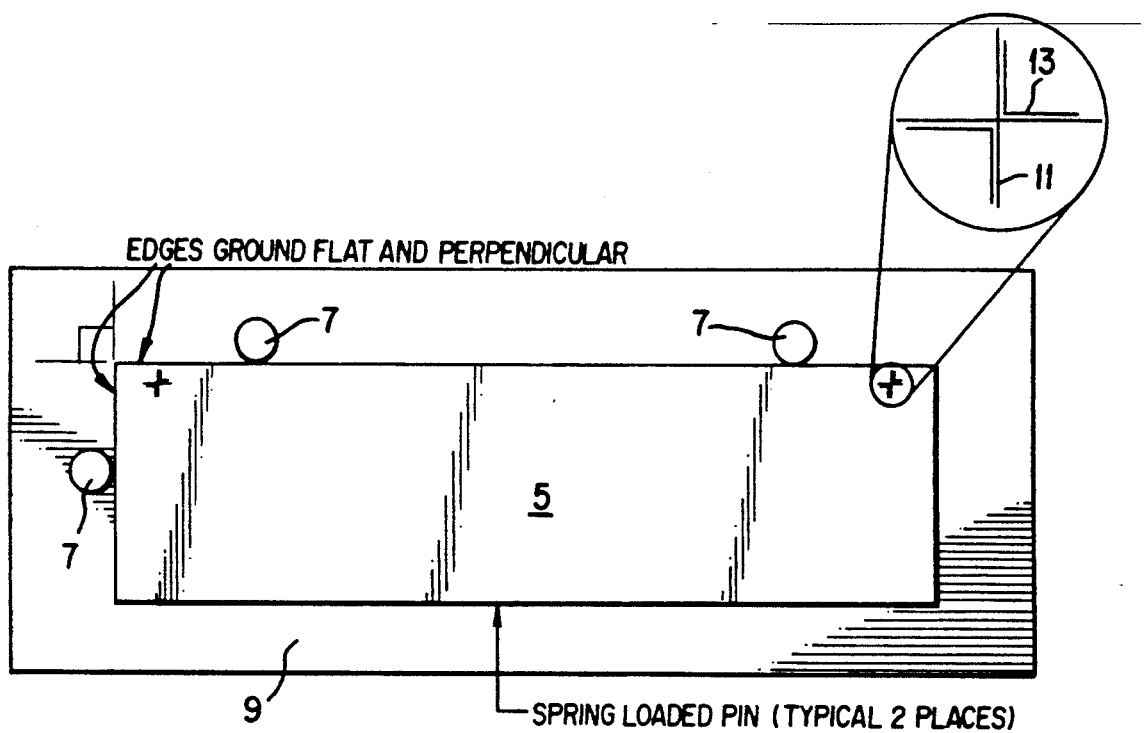
FIG. 3 is a top view of some of the apparatus for making the high-density circuit of the invention, including the tooling pins which enable the substrate to be precisely registered.
Figure 4:
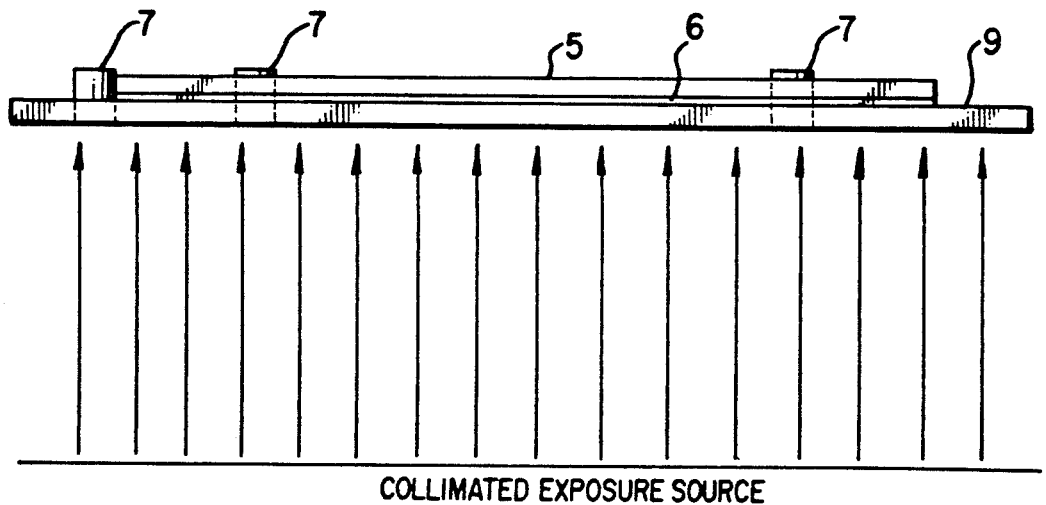
FIG. 4 is a side elevational view of the apparatus of FIG. 3, also indicating the exposure of the photoresist layer to a source of light.

FIGS. 3 and 4 show the general arrangement of the tooling fixture. Substrate 5, having photoresist layer 6, is held against tooling pins 7, and over the mask 9. Crosses 11 are etched on the substrate during the first layer processing cycle; in subsequent processing cycles, one may check to be sure that these crosses are aligned with fiducial marks 13 on the phototool, to insure that the registration is proper. FIG. 4 shows the light from a collimated source impinging on the photoresist layer.

All of the layers of tooling required for single-layer or multilayer circuitry use the identical tooling pin arrangement. Thus, the substrate is registered to the various printing masters in the same point each time. Layer-to-layer registration of 0.0002 inches, or better, over long linear lengths, can be achieved in this manner. The alignment fiducials, placed on the first layer, are carried through each of the subsequent tooling master layers so that the operator can make a quick visual check of the positional accuracy of each layer. For greater accuracy, a mask alignment system could be constructed using state of the art semiconductor mask alignment technology.

As stated above, the phototool is used to expose the circuit pattern on the photoresist-coated substrate which is to become the final product. The photoresist is developed, inspected, retouched, and baked for hardening, and the metallic coating is etched away from the circuit paths. Suitable etchants for metallic coatings such as chromium or LC-102 are commercially available. The dielectric coating is then etched using buffered hydrofluoric acid as an etchant. The etchant formula, and the time and temperature of etching, are closely controlled to produce a specific depth of etch relative to the etched line width. Etch depths of ⅛ to ⅝ of the line widths, for fine lines of 0.0005–0.003 inches wide, are used to produce the desired circuit conductor profile. Spacing between the lines can be as little as 0.0005 inches. The above-mentioned etch depths determine the cross-sectional area of the conductive lines. This cross-sectional area must be sufficient to allow relatively large currents and/or voltages to be used.

After the grooves are etched into the substrate, the photoresist and the metallic coating are stripped from the substrate, and the conduction paths filled with the cermet material. The excess cermet material is skived off with a single-edge razor blade, and the substrate is baked at a temperature in excess of 250° F., for a time long enough to drive off the volatile chemicals in the cermet, usually about ten minutes. Several filling and baking cycles may be required to achieve the proper amount of cermet fill. In general, wider conductors require more filling cycles than thinner conductors. After the last filling and baking cycle, any residual cermet may be removed from the smooth glass or dielectric surface, by lightly wiping the surface with cotton. It is important to note that without the surface preparation process described earlier, which removes defects which occur in conventional glass and ceramic substrate materials, the cermet will fill the defect areas, will cause short circuits and/or line breaks in the final product.

The cermet-filled substrate is fired in a residue-free kiln under semi-clean room conditions. The cermet firing temperature is generally close to the fusion temperature of the dielectric for lowest resistivity. In the case of the soda lime glass substrate, the firing temperatures are kept below the annealing temperature of the glass, and the substrate is supported to minimize warping or slagging of the glass during firing. The firing forms a bond between the dielectric, or glass, and the cermet.

As mentioned above, the choice of cermet depends in part on the desired resistivity of the circuit elements. It also depends on the bonding medium. For wire bonding, soldering, or surface mounting, cermets compatible with these processes are desirable.

It is also possible to use cermets that have superior electrical conductivity, and to plate the ends, where the circuit connections are to be made to the driving electronics, with a compatible material such as gold. Those skilled in the art of microelectronic hybrid fabrication are aware of the various possible connection techniques for individual and multiple conductors. This invention extends and expands this technology to much larger arrays of conductor paths and connection points. Where the components are to be wire bonded or soldered, platinum/gold cermets, such as Product No. 5837 of Electro-Science Laboratories, Inc., have been used with great success.

As stated above, one of the applications of the high-density circuit is in the field of print heads. The ability to fabricate very closely-spaced circuit lines implies the ability to generate high-resolution images, by using each line, or pair of lines, to produce a picture element (pixel) on a medium.

In the case of a thermal printer, the printing is done by heating appropriate regions of a heat-sensitive paper or other medium. The heating is typically done by energizing selected portions of a resistive bar which is in contact with the paper. Such a resistive bar is described in U.S. Pat. No. 4,604,298. In the context of the present invention, this resistive bar can itself be a cermet, applied to the circuit by screening techniques that are well known to those skilled in the art of making thermal print heads. The advantage of burying the conductors in the dielectric, as described in this invention, is that the bar profile is not disturbed by conductors on the surface of the print head, and is thus more uniform. The resistance between each pair of conductors is therefore more uniform. The dielectric strength between each conductor is also increased by burying the conductor into the surface of the dielectric. The latter statement is true for the case of a print head for an electrostatic printer, as well as for a thermal printer.

Figure 5:
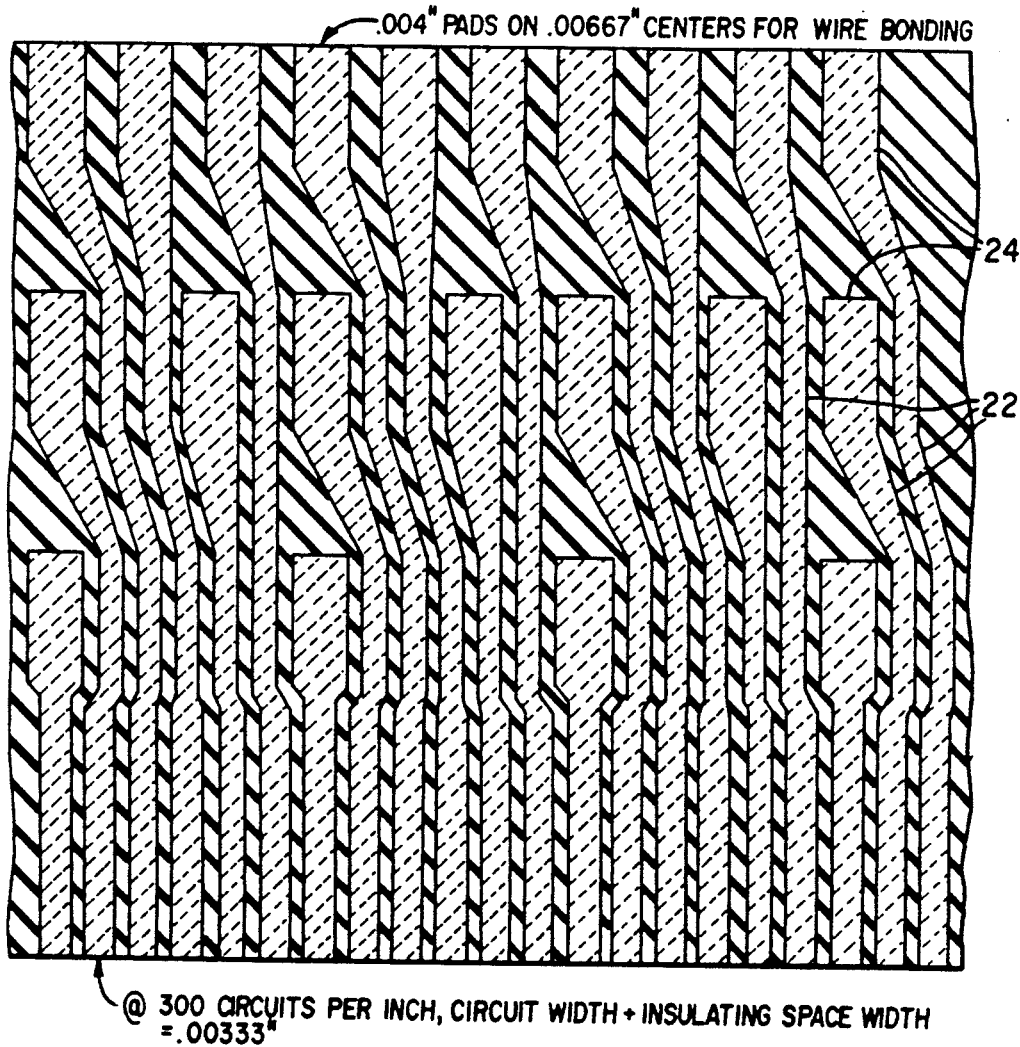
FIG. 5 is a top view of a portion of a high-density circuit made according to the invention, wherein there is a single layer of circuitry, having a density of 300 lines per inch.
Figure 6:
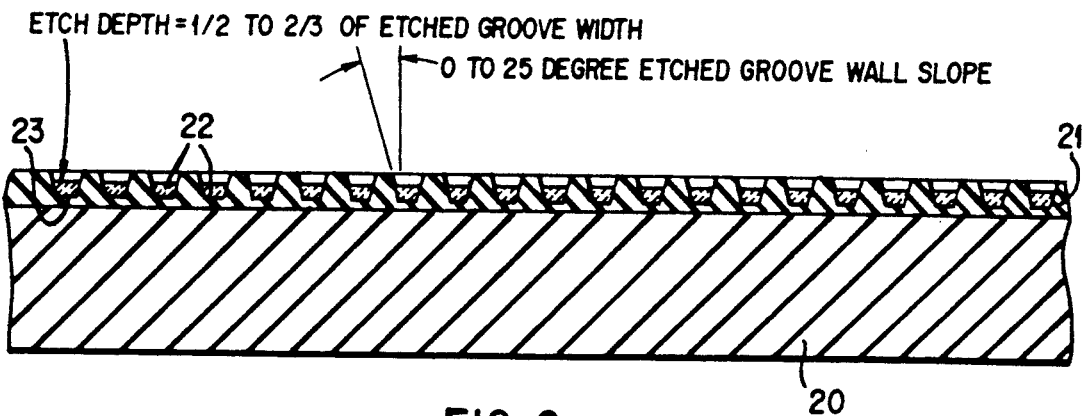
FIG. 6 is an end view of the circuit shown in FIG. 5.

FIGS. 5 and 6 illustrate the design approach for a single-layer print head, having line densities of up to about 300 lines per inch. Conductive cermet 22, disposed within grooves 23 in dielectric layer 21, define the lines of the circuit. These lines are widened into pads 24, to facilitate connection to external components. FIG. 5 shows how the pads can be arranged in rows, so that all of the circuit lines can be appropriately connected. Substrate 20 is also shown. If substrate 20 is a ceramic material, then dielectric layer 21 is distinct from substrate 20. If substrate 20 is glass, then layers 20 and 21 can be part of the same piece of material.

Figure 7:
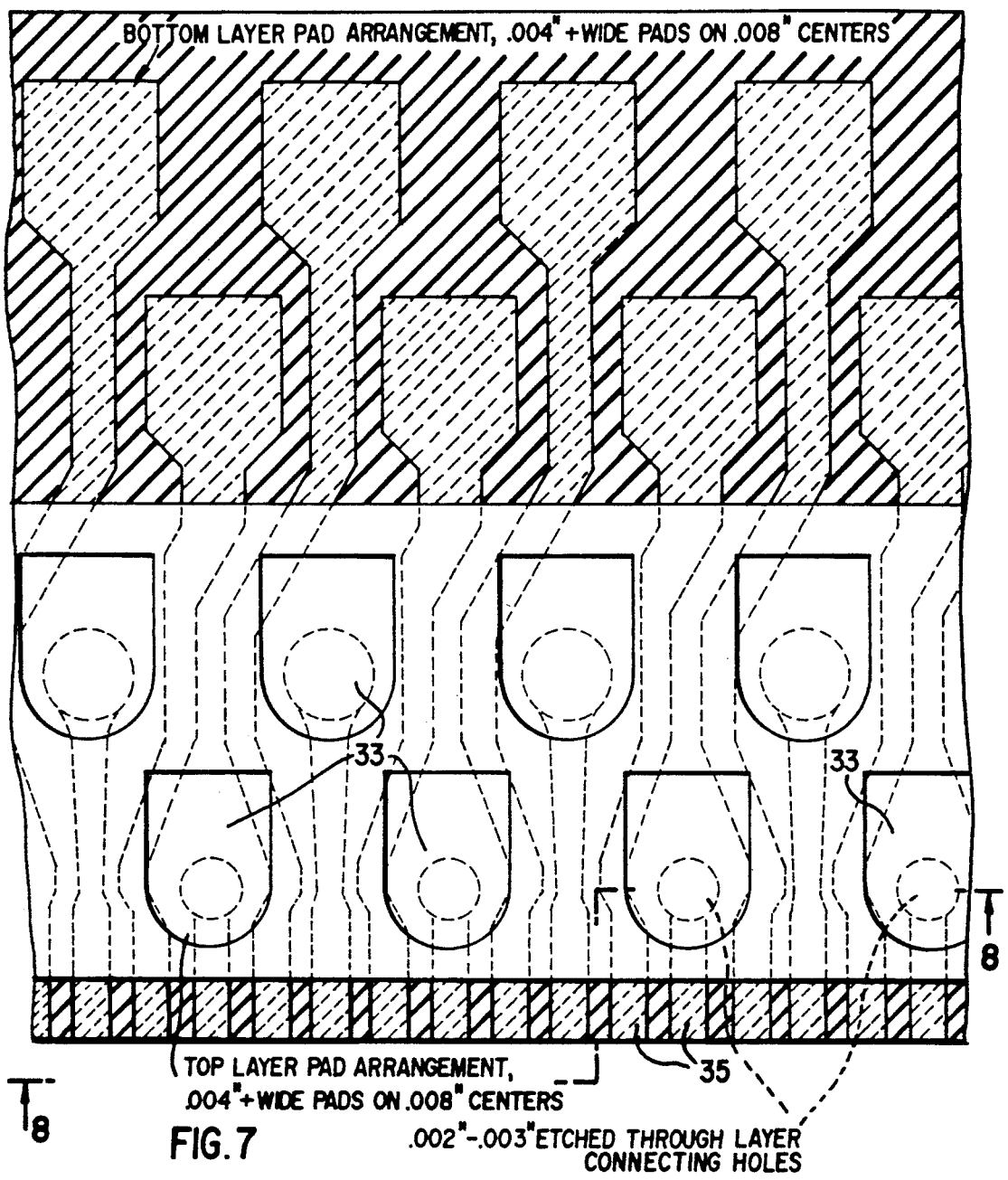
FIG. 7 is a top view of a single-layer, 500 line per inch circuit array, made according to the invention, wherein the pads of the circuit are brought out in two layers.
Figure 8:
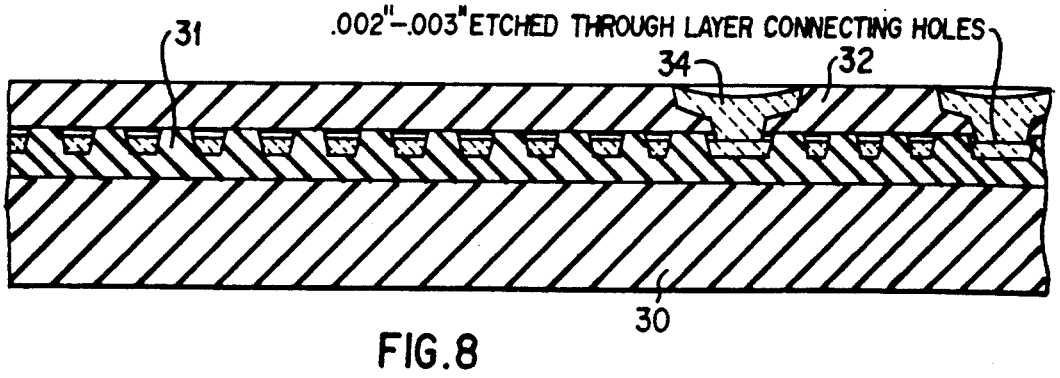
FIG. 8 is view taken along the line 8—8 of FIG. 7.

FIGS. 7 and 8 illustrate a design approach for print heads having line densities of up to 500 lines per inch. The single circuit layer is formed on dielectric 31, disposed over substrate 30. The circuit includes lines 35 of conductive cermet. As before, if the substrate is glass, then the substrate and dielectric can be the same. A second dielectric layer 32 is located above dielectric layer 31, but does not extend across the entire area of the first layer, as illustrated in the top view of FIG. 7. Pads 33 of the top layer are formed of conductive cermet, as shown in the cross-sectional portion of FIG. 8, and these pads are electrically connected to pads in the first layer through cermetfilled holes 34. The width of the holes is preferably less than that of the underlying pad, to prevent the cermet filling the hole from spilling over onto adjacent circuit lines.

Thus, the two sets of figures described above, namely FIGS. 5 and 6, and FIGS. 7 and 8, show different means of connecting the circuit elements to outside components. The single layer, 300 line per inch circuit of FIGS. 5 and 6 is connected to the external electronics in one layer. The higher-density, 500 line per inch circuit of FIGS. 7 and 8 is contained on one layer, but its pads are distributed between two layers. In the circuit of FIGS. 7 and 8, the external electronics can be surface-mounted components and connectors, or wire bonded flexible circuits, for the top layer, and surface-mounted components, connectors, flexible and printed circuits for the bottom layer.

There are two general methods by which the circuit elements of one layer, in the circuit of FIGS. 7 and 8, can be brought out to another layer, for connection to external components. The choice of method depends on the processing preference of the fabricator. Both methods are described below.

In the first method, a metal mask is fabricated from 0.001 inch thick stainless steel, a beryllium-copper alloy (such as Berylco alloy 25, available from Beryllium Corporation of America), or molybdenum. The molybdenum is especially preferred. The tooling to make the mask is manufactured on the Max Levy Autograph Machine, described above, to the same close tolerances and registration requirements as for the circuit tooling described earlier. The metal mask has holes of a diameter of 0.002–0.003 inches, etched through the mask at the sites where the circuit line on the first layer is to be brought out to the top layer. The metal mask is mounted in a tooling frame that has tooling pins that align it with the substrate tooling location points as shown in FIGS. 3 and 4.

The metal mask is used as a stencil to squeeze small dots of highviscosity potters wax (such as that sold by Creek Turn Pottery, Hainesport, N.J.), onto the circuit where the connections to the bottom layer are desired. If the second layer of dielectric is to be sprayed, spun, or dip-coated, the lower layer of circuitry is masked off, such as with green masking tape, to delineate the band where the second layer of dielectric will be placed. If the second layer of dielectric is to be screened onto the substrate, the screen is constructed with the appropriate masked areas.

The top layer of dielectric is applied in two equal thickness layers, as required to achieve an after-firing thickness of about 0.001–0.0015 inches. The first layer is screened, sprayed, spun, or dip-coated over the entire area to be coated and air-dried or baked. The small dots of wax are then stenciled over this first layer and a second layer of dielectric applied. When the dielectric layer is applied by screening, the screening pressure must be controlled to prevent uneven spreading of the dots of wax.

The top dielectric layer is fired at a temperature that is the same or slightly below the firing temperature of the cermet and dielectric underlayer. The temperature must be high enough to allow the screen marks to disappear, but not too high as to cause the "dots" to close over completely. The wax acts as a blocker to the dielectric, and the result is small holes part way through the dielectric where the connections between the top and bottom layers are to be made.

The top layer is deburred slightly to remove any protrusions around the dot areas. The top layer is then metalized, coated with photoresist, printed, developed, and etched to expose the connection pads. The connection pads are etched with buffered hydrofluoric acid. Since the thickness of the dielectric in the "dot" area is about ½ the thickness elsewhere, the dots will be etched through from the top to the bottom layer of circuitry, when the pads have been etched into the top layer.

The second method of connecting the circuit to external electronics is as follows. A chromium on glass tooling mask is constructed, including small dots having diameters of about 0.0015–0.0025 inches. The dot size depends on the required diameter of the hole which is to be etched through the circuit, and is compensated for the enlargement of the upper region of the hole which occurs when the dielectric layer is etched with buffered hydrofluoric acid. A second chromium on glass mask is constructed with the top layer pad pattern.

If the second layer of dielectric is to be sprayed, spun, or dipcoated, the lower layer of circuitry is masked off, such as with green masking tape, to delineate the band where the second layer of dielectric will be placed. If the second layer of dielectric is to be screened onto the substrate, the screen is constructed with the appropriate masked areas.

As in the first method, the top layer of dielectric is put down in two or more layers, to obtain a thickness of about 0.001–0.0015 inches. The top layer is then fired at a the same temperature as in the first method.

After firing, the top layer is coated with metal and photoresist, printed with the layer-connecting dots, and developed. The layer is etched through the metallic coating to expose the connecting dots. The exposed dielectric is etched half way down, towards the circuitry in the lower layer, at each dot, using buffered hydrofluoric acid. The resist is stripped and the part recoated with resist and printed with the pad mask, developed and etched through the metallic coating to expose the pads. The pads are etched down into the dielectric a little more than half way. Since the connecting dots are already etched half way through, they will be etched through to the lower circuit paths when the pads are etched. Thus, the pads on the second layer can easily be electrically connected to the pads on the first layer, by filling the pads and holes with cermet and firing, after the resist and metallic layers are stripped from the second dielectric layer. The firing is done in the same way as in the case of the first layer of cermet.

The second of the above-described methods for connecting the circuit to pads on a second layer has been found to be easier to control. It is comparatively difficult to control the distribution of wax, as it is being squeezed through a mask, and it is inherently difficult to control the behavior of the ceramic in the regions of the wax dots.

It is also possible to use the wax technique or the hole etching technique, as described above, to create holes that go through the entire top layer in one firing or etching cycle. The cermet used to make the electrical connections between layers is then forced into the connecting holes, skived off, and the pads screened on top of the dielectric layer using a thin metal stencil or screening mask. This third method is appropriate for top layer pads where the distance between pads can be made large enough to allow for the inherent inconsistencies of the process.

The process for making multilayer thermal print heads is essentially the same as the process for making multilayer electrostatic print heads, except for the image-transfer edge. The common aspects of these processes are first described, followed by a description of the processes required to fabricate two different end configurations typical of the differences in the two printing heads.

The first layer circuitry for a multilayer thermal or electrostatic print head, capable of producing an image having a resolution in the range of 600 pixels per inch, is constructed in nearly the same manner as a single-layer 300 pixel per inch head. The circuit path distance from the image plane to the connection pads is extended so that the second layer can be placed on top of the first, such that the connection pads for the top layer are closest to the image plane. This permits the connection of the lower layer to flexible or rigid circuits, devices, surface mount connectors or other components through soldering, wire bonding and/or current surface mount technology. Then, one can overlay a second set of flexible circuits, devices, surface mount connectors or other components, so that these are on top of the first layer.

Construction of the second layer of circuitry is accomplished by screening, spraying, or dip coating a layer of dielectric over the first layer of circuitry, in a manner similar to the method described for the single-layer, 500 line per inch print head array with two pad layers. The major difference is that this process is simpler and does not require the generation of connecting paths between layers. It is noted however, that a design could be constructed with driving electronics surface mounted to the top layer, with connecting paths etched through to the lower layer, for connection to other circuits or devices mounted to the first layer.

If the dielectric is to be sprayed or dipped, the area where the first layer connection pads are located is masked with tape. If the second dielectric layer is screened on, the screen is constructed to form the mask over the first layer connection pad area. A dielectric layer in the thickness range of 0.001–0.0015 inches is generally satisfactory for multilayer construction. The exact layer thickness is dictated by the insulation resistance required between the circuit conductors, the desired pixel geometry, and the etch depth required to generate the required post-firing thickness of the cermet.

The second layer of dielectric is fired using a similar temperature/time profile, and with the same care, as in the case of the first layer of dielectric. The surface quality after firing must be as good as in the first layer.

After firing, the second layer of dielectric is metalized, resistcoated, and imaged, again with closely-registered chromium on glass or etched and filled tooling. The image is developed, and the substrate is etched to remove the metallic coating in the circuit areas, and then etched with buffered hydrofluoric acid to form the circuit paths and pads in the second layer of dielectric.

The residual resist and metallic coating is stripped, the circuit paths and pads filled with conductive cermet, and the part is fired in the same manner as for the first layer. These processing steps are essentially the same as those required for the first layer. It is not necessary to mask off the lower level of circuitry during the filling of the top layer of circuitry with the conductive cermet, unless two different cermets are used for each layer. Without such masking, additional cermet applied to the second layer would fill the spaces in the grooves formed by shrinkage of the first-layer cermet during firing.

Figure 9:
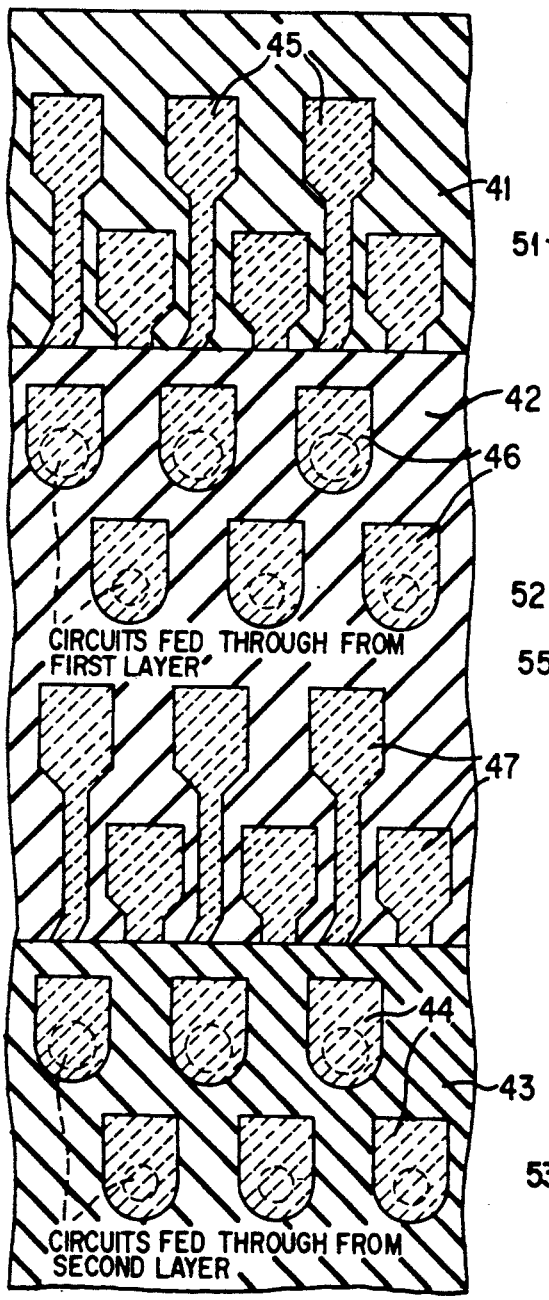
FIG. 9 is a top view of a two-layer circuit, made according to the invention, having 1000 lines per inch, and wherein some of the circuit pads are brought out onto a third layer.
Figure 10:
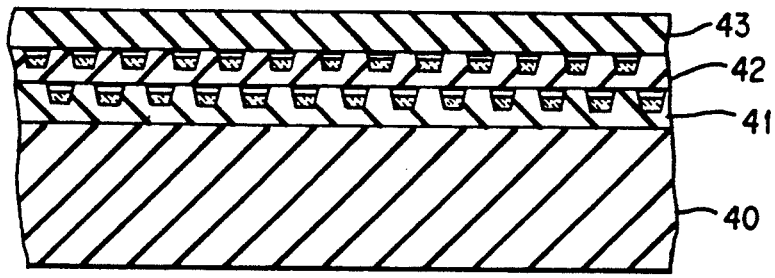
FIG. 10 is an end view of the circuit of FIG. 9.

For multilayer thermal or electrostatic print heads, capable of producing images with resolutions in the range of 1000 pixels per inch, the array can be constructed in two layers capable of 500 pixels per inch per layer, or in three or more layers. An example of a two-layer construction is shown in FIGS. 9 and 10. The circuit includes substrate 40, and dielectric layers 41, 42, and 43. As before, if substrate 40 is glass, it may be integral with dielectric layer 41. Only layers 41 and 42 contain the actual circuitry; layer 43 contains only pads 44. The first circuit layer 41 is constructed in the same way as the single layer capable of 500 pixels per inch, except that the first layer circuitry is extended further back before the pad feed-through connections to the second layer are formed.

The first layer contains 250 pads for connection to the outside, these pads being designated by reference numeral 45. The remaining 250 pads from the first layer are brought through to the second layer, and these pads are connected through to pads on the second layer, the latter pads being designated by reference numeral 46. The second layer circuitry is capable of generating 500 pixels per inch. The second layer has 250 pads of its own, designated by reference numeral 47, plus the 250 pads 46 brought up from the first layer. A third dielectric layer, not intended as an image-producing element, contains the remaining 250 pads 44 that are brought through from the second layer.

Figure 11:
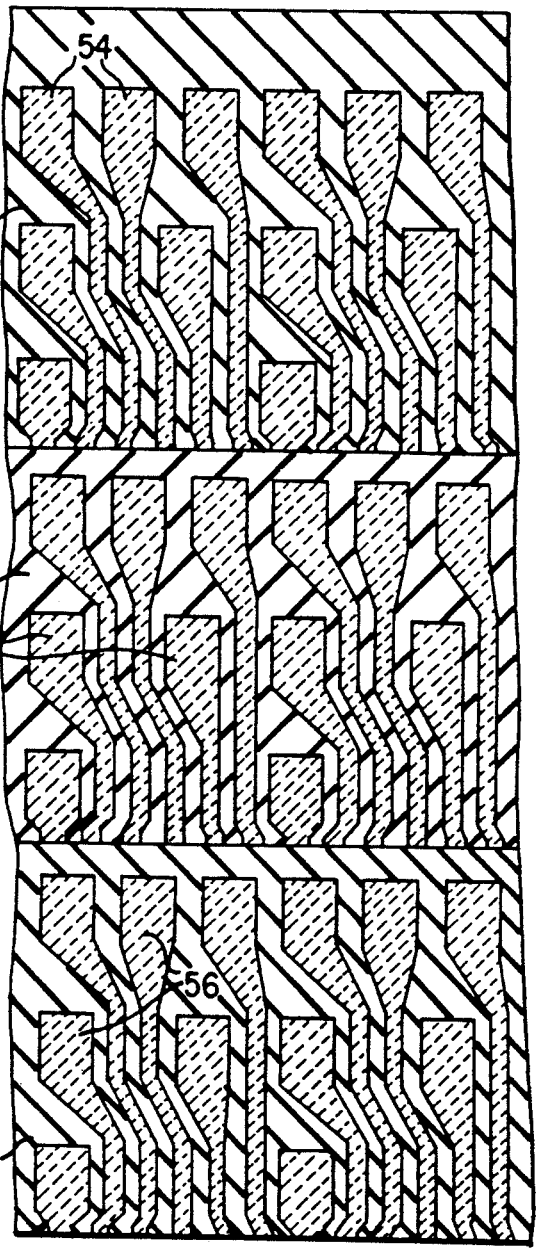
FIG. 11 is a top view of a three-layer circuit, made according to the invention having 1000 lines per inch.
Figure 12:
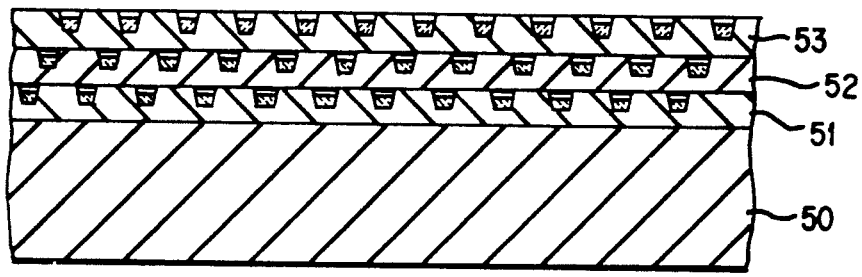
FIG. 12 is an end view of the circuit of FIG. 11.

FIGS. 11 and 12 illustrate the case where three layers are used to construct an array capable of 1000 pixels per inch. There are three circuit layers, 51, 52, and 53, disposed on substrate 50. Each layer can contain 333 circuit lines and pads as described for the single layer, 300 pixel per inch array, except that the line spacing between the pads and the adjacent line is reduced to 0.0012 inches when the pad size is held at 0.004" for wire bonding. This is still well within the capability of current state of the art wire bonding. The three layers of pads are staggered, as previously explained for the two-layer 600 pixel per inch multilayer array. Thus, the bottom layer pads 54, the middle layer pads 55, and the top layer pads 56 are directly accessible to outside components.

A four-layer array, capable of producing 250 pixels per layer, using the same technique as for the three-layer array, can also be constructed. The specific pixel arrangement is dictated by the print head system specification.

Regardless of the number of layers, the circuit line widths and spaces are chosen to give the best printing fidelity. It may be desirable to provide a slight underlapping or overlapping of the circuit elements, depending on the type of printer head being constructed. FIGS. 13–16 show examples of the end configurations for the multilayer thermal and electrostatic print head.

Figure 13:
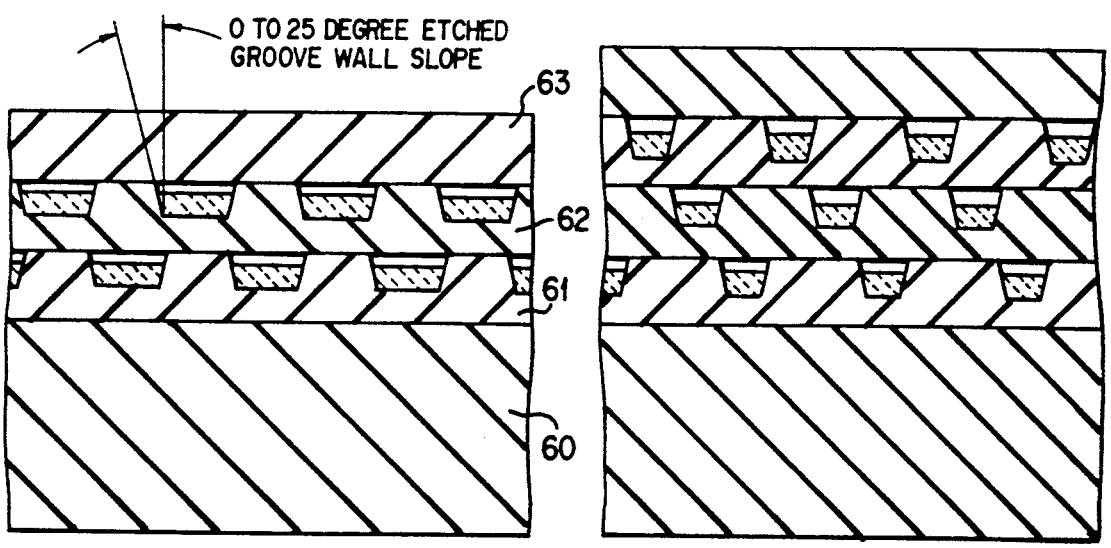
FIG. 13 is an end view of a print head, having two layers of circuits made according to the present invention, for use in an electrostatic printer.
Figure 14:
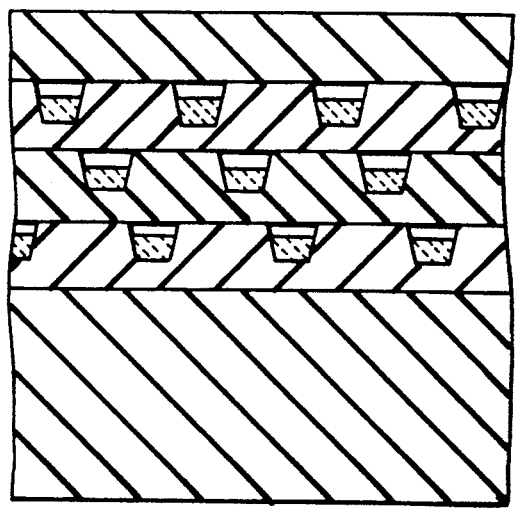
FIG. 14 is an end view of a print head, having three layers of circuits made according to the present invention, for use in an electrostatic printer.

FIG. 13 shows an end view of a two circuit-layer configuration for an electrostatic print head. Circuit layers 61 and 62 are formed over substrate 60, and nonconductive protective layer 63 covers the top layer. The conductors are staggered to maximize the resolution capability of the printer. FIG. 14 is essentially the same as FIG. 13, except that there are three circuit layers. The overcoating or protective layer is generally needed in an electrostatic print head, to prevent residual toner from short-circuiting the conductors. The overcoating can be accomplished by screening and firing a layer of dielectric over the image transfer area of the head. The top layer can also be overcoated with epoxy, polimide, or other nonconductive coatings or covers to prevent this short-circuiting.

The thermal print head requires that the image edge be ground flat, coated with a resistive cermet, and fired. The latter cermet layer comprises the resistive "bar" which is heated in various locations, to produce a pixel. The thickness of this cermet layer is controlled by mounting the substrate, after the edge is ground flat, in a fixture that places the edge below two parallel edges by a set amount. The resistive cermet is placed into the groove formed by the two parallel edges of the fixture and the edge of the substrate, and the excessive cermet skived off. The resistive cermet is baked, the fixture removed, and the substrate fired with the edge either up or down, and with the substrate parallel to the horizontal to prevent any adverse gravity flow of the resistive cermet during firing.

FIGS. 15 and 16 show end views of the preferred configuration for the image transfer end of a multilayer thermal print head. In FIG. 15, there is shown substrate 70, and circuit layers 71 and 72, having staggered conductors. Shown in fragmentary form is the resistive bar 73, preferably formed of a resistive cermet material, used to generate heat to form pixels. FIG. 16 is essentially the same as FIG. 15, except that there are three circuit layers.

Various other end configurations are possible using this technology for generation of fine-line multilayer arrays. This description is for arrays having up to three layers; however, the basic process steps can be used to form additional layers.

The generation of grey steps, in an electrostatic printer, is achieved by controlling the percentage of time that the charge is applied to the individual image-generating elements, relative to the time required for the charged transfer drum, plate or belt to traverse a set cell distance.

FIG. 17a–i illustrates the method of operation of an electrostatic print head. They show the configuration of pixels so as to generate halftones, for black and white and color printing, and, in the case of color printing, minimize the Moiré effect. The latter effect results from interference between different color components of a multi-color image. The effect can be overcome by orienting each "cell", or group of pixels forming a basic component of the image, at a different angle, depending on the color of the light. The latter angle is known as a "pseudo-screen angle". In the case of black and white or one-color halftone generation, screen angles need not be considered.

Figure 17D:
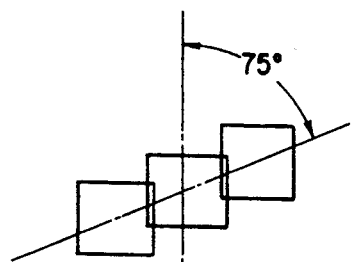
FIGS. 17a–i contain schematic diagrams of various pixel configurations for an electrostatic printer, produced by the print head of the present invention.
Figure 17I:
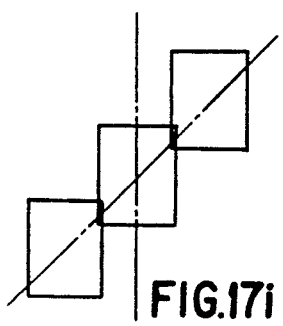
Figure 17C:
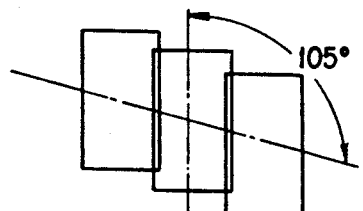
Figure 17H:
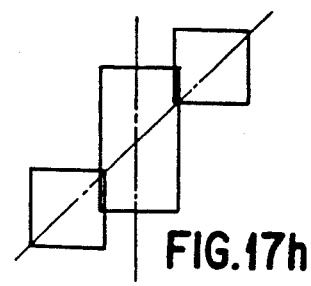
Figure 17B:
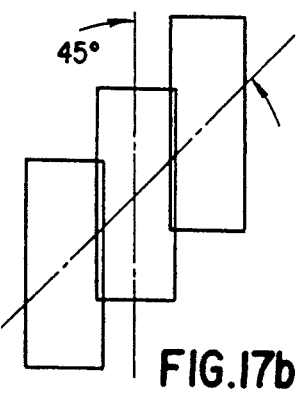
Figure 17G:
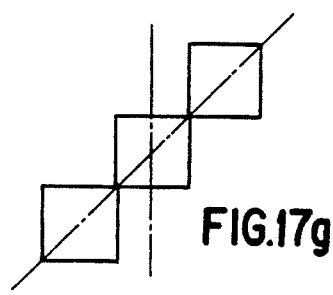
Figure 17A:
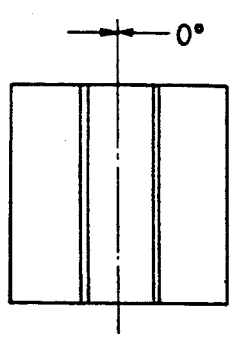
Figure 17F:
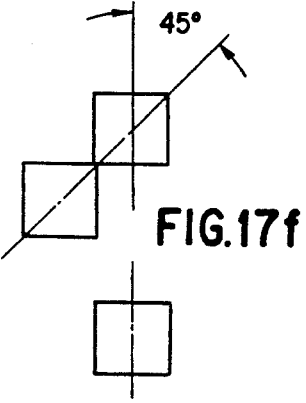
Figure 17E:
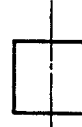
Figure 17:
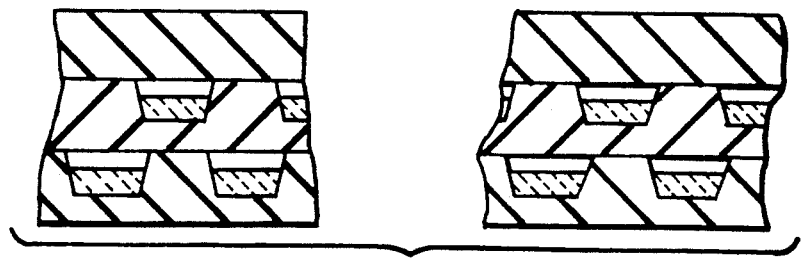
FIG. 17 is a fragmentary view of a double-layer print head.

FIG. 17 shows fragments of portions of two double-layer circuits, and FIGS. 17a–i show various arrangements of pixels. The pixel arrangements are designated by the letters a through i. In each case, the image-generating circuit elements are shown overlapped slightly. Each cell of the image contains three pixels. The length of each pixel can be varied continuously, depending on the time during which the appropriate conductor is energized.

Pixel arrangement a represent the case where all three circuit elements are energized for the time required to fill the entire length of the cell, at a screen angle of zero, with respect to the vertical. Pixel arrangement b shows the case wherein the pixels have the same length as in arrangement a, except that the circuit elements have been energized in a staggered fashion, so that the pixels form an angle of 45°, with respect to the vertical. The length of each pixel, i.e. the time during which the corresponding circuit element is energized, determines the grey scale level of the pixel. Pixel arrangements c and d show screen angles of 105° and 75°, respectively, at a lower grey scale level than that shown in a or b. These screen angles, shown in a through d, are examples of angles that can be used to print four-color halftone images with the electrostatic printer, with minimized Moiré effect. In general, to minimize the Moiré effect, the angles are selected to maximize the angle between pixels of the most dominant colors.

Pixel arrangements e through i illustrate different levels of grey scale, for the same screen angle. In the example shown, this screen angle is 45°. Each cell of the image contains nine square pixels. The width of a pixel equals the width of the circuit element along the print head array, i.e. the x-axis, and the length of the pixel, i.e. its dimension in the direction of travel of the paper, is equal to this width.

Pixel arrangement e shows the case where one pixel of the nine-pixel cell is printed. This is the first step of the grey scale, and represents about 11% of the cell area. FIG. 18 is a graph which shows the percentage of the area of the cell which is opaque, for each different number of pixels printed. In the case of arrangement f, there are two pixels printed, and the percentage opaque is now about 22%. In addition, these two pixels define the screen angle. A minimum of two pixels is needed to define such an angle.

In arrangement g, there are three pixels printed, and the percentage opaque is now about 33%. Arrangements h and i show two different means for forming the next and subsequent steps of the grey scale. In arrangement h, the fourth step is generated by energizing the center pixel for the time necessary to produce two pixels. The adjacent pixels, when added to the central two pixels, form the four pixels required for the fourth grey scale level. In arrangement i, the fourth step is generated by splitting the additional pixel across the three-pixel array, so that each pixel is 1.33 pixels in length. Additional grey scale levels could be created by using shorter y-axis increments and/or turning on partial pixels along fewer than all of the circuit elements within a cell.

If we assume that the head design shown in FIG. 17 consists of a two-layer 600 line per inch array, where each layer of the array includes 300 lines per inch. This arrangement produces an effective line count of 200 lines per inch across the x-axis, for a 3-pixel cell. If the y-axis travel is set at an equivalent 3-pixel length, the cell is a 3×3 pixel cell. A pixel cell of 2×2 pixels is equivalent to a printing resolution of 300 lines per inch. A 4×4 pixel cell is equivalent to a printing resolution of 150 lines per inch. A 5×5 pixel cell is equivalent to a printing resolution of 120 lines per inch. Most high quality halftone color printing is done at pixel counts in the range of 110 to 200 lines per inch, with 150 lines per inch being the most popular current standard. The range of pixel cell sizes from 5×5 to 3×3, as described herein, is very suitable for the printing of high quality halftone color images using electrostatic printer technology.

Since multilayer arrays to 1000 lines per inch are possible, under this invention, design applications that require printing resolution greater than the above-mentioned standards are possible.

The specific tradeoffs of array count, printing cell size, number of colors to be printed, number of grey levels, printing speed and complexity of the driving electronics need to be determined for each particular image transfer application. The electrostatic print head design, as described herein, is capable of accommodating these tradeoffs and spanning a wide range of high-quality printing applications.

In the case of a thermal print head, all of the circuit elements are connected by a resistive cermet layer across the end of the array; the latter cermet layer is what is heated to produce pixels on the paper. A multilayer print head, to be described in the examples below, has circuit elements arranged in groups of five; each group of five circuit elements comprises a cell of the image.

The voltage applied to each circuit element can assume one of three states, either positive, negative, or "open". The open state means that there is a high impedance to ground on the circuit element, such that no significant amount of current can flow through the conductor from positively or negatively charged adjacent circuit elements. A pixel will be generated, by two adjacent circuit elements, when one of these elements is positive and the other is negative. If adjacent elements are held at the same voltage, or if either or both are "open", no current will flow between them, and no pixel will be generated.

Figure 19C:
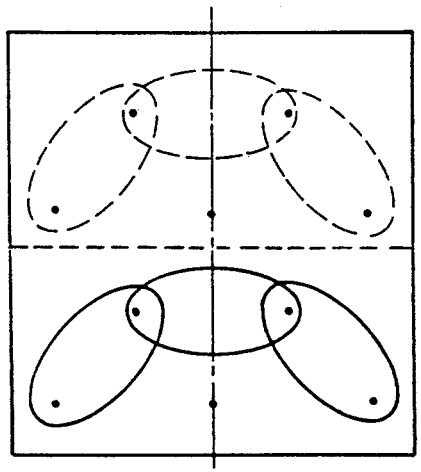
FIGS. 19a–j contains schematic diagrams of pixel configurations for a multilayer thermal print head, made according to the invention. The Figures illustrate blue pixels as solid ellipses, and show yellow pixels as dotted ellipses.
Figure 19F:
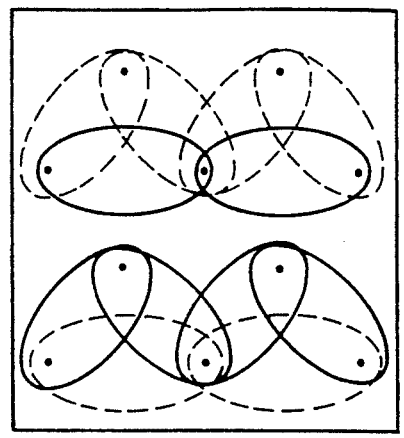
Figure 19B:
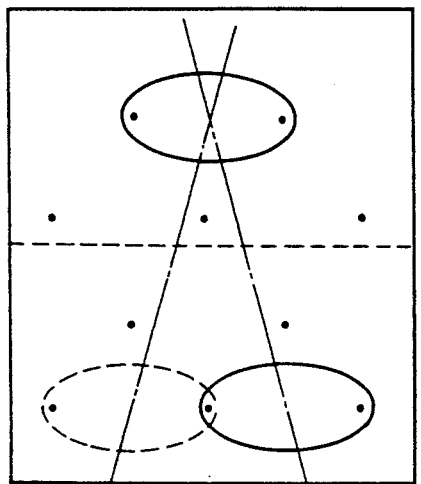
Figure 19E:
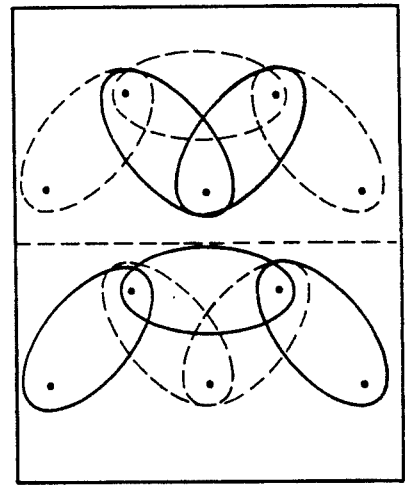
Figure 19A:
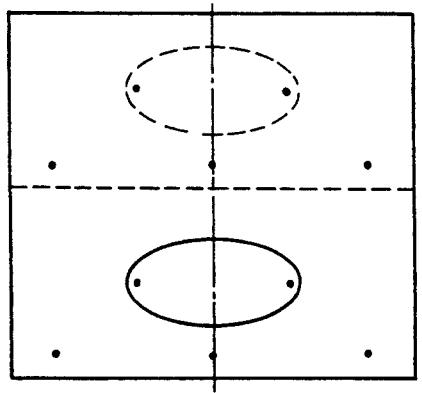
Figure 19D:
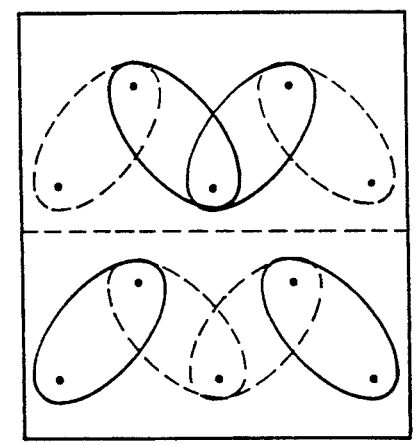
Figure 19:
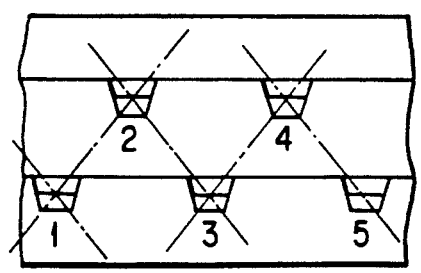
FIG. 19 is a fragmentary view of a print head.
Figure 19J:
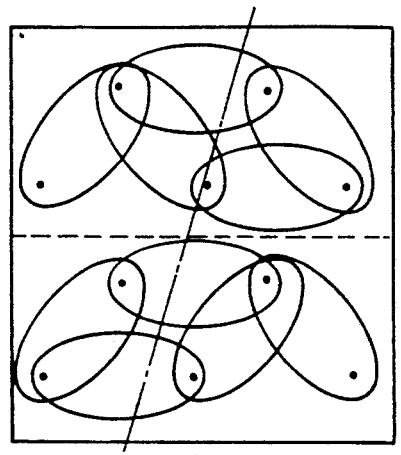
Figure 19I:
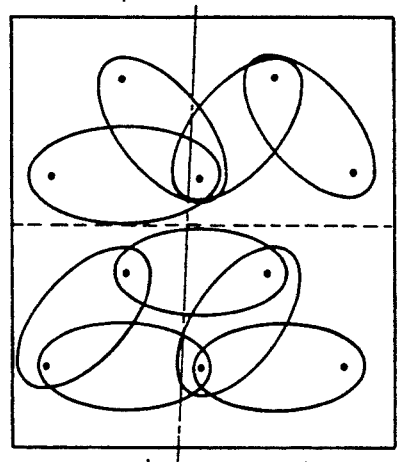
Figure 19H:
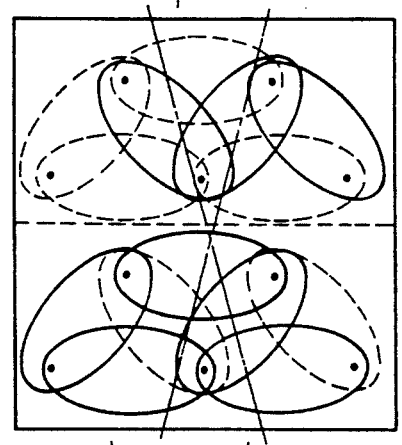
Figure 19G:
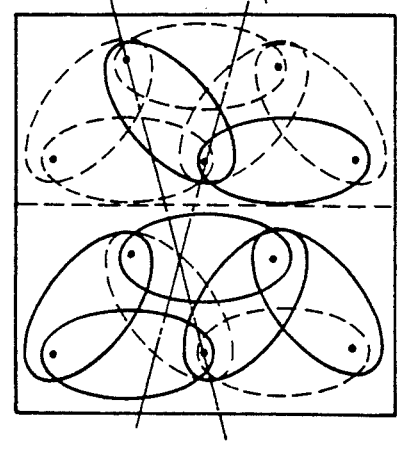
Figure 20C:
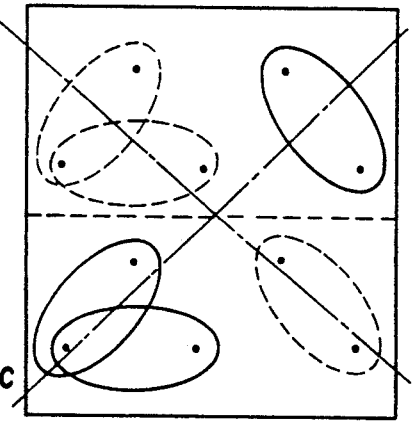
FIGS. 20a–j are similar to FIGS. 19a, but showing pixels of two additional colors, wherein the general angles defined by the pixels do not coincide with those in FIGS. 19a–j in the examples of FIGS. 20a–j the solid ellipses represent red pixels and the dotted ellipses represent black pixels.
Figure 20F:
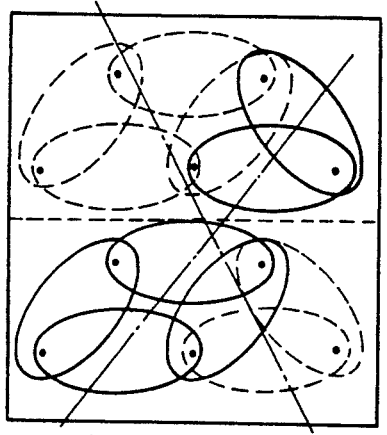
Figure 20B:
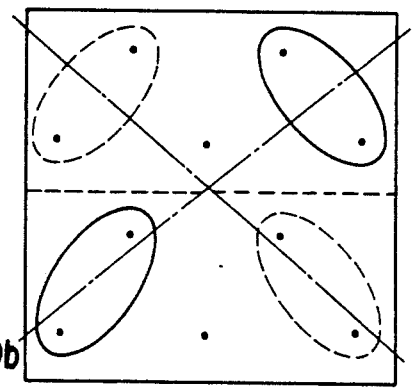
Figure 20E:
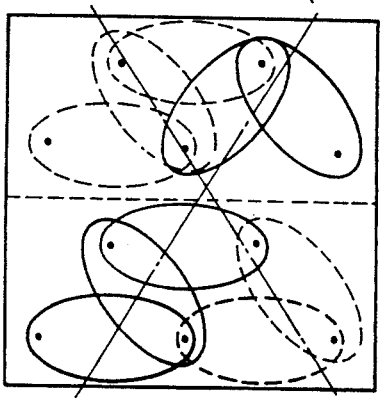
Figure 20A:
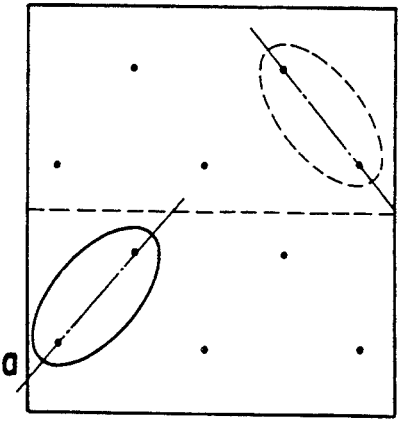
Figure 20D:
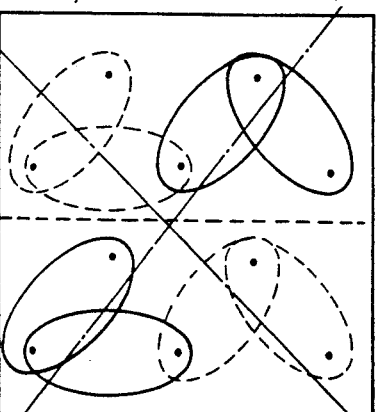
Figure 20:
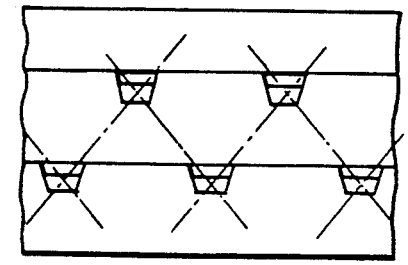
FIG. 20 is a fragmentary view of a print head.
Figure 20J:
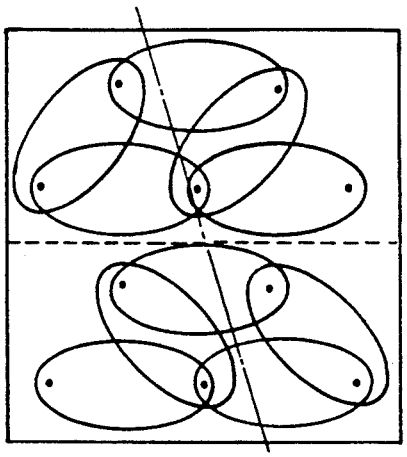
Figure 20I:
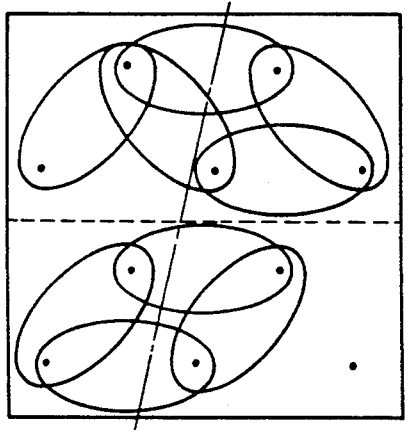
Figure 20H:
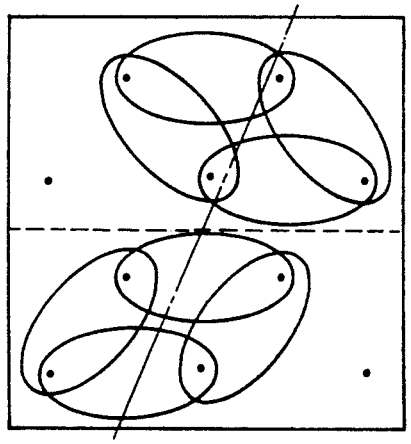
Figure 20G:
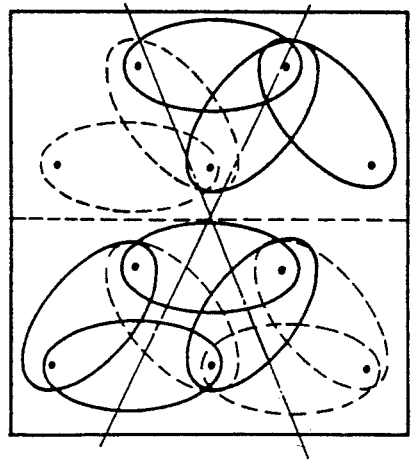

FIGS. 19 and 20 show a possible set of configurations of pixels, generated by a two-layer thermal print head capable of producing color images, with pseudo-screen angles. In these figures, each region of the resistive bar, which is heated to form a pixel, is represented by an ellipse. Thus, each ellipse roughly encloses the region between two circuit elements which are energized to form the pixel.

FIGS. 19 and 20 show a fragment of the two-layer thermal print head. The circuit elements being illustrated are numbered 1 through 5. In the example shown in these figures, each cell of the image contains two five-pixel arrays. These arrays could be printed sequentially by one two-layer print head, with appropriate control of the movement of the paper, or they could be printed simultaneously by a four-layer print head, with or without modification of the printing algorithm.

Table 1 lists all of the possible combinations of pixels that can be generated with the 5 pixel set described above and illustrated in FIGS. 19a–j and 20a–j. The table shows the state (positive, negative, or open) of each of the five circuit elements, the states being designated as P, N, or O. The numbers at the right of the table show the pixels that are produced for the voltage configuration shown at the left. For example, in the first line of the table, all of the five circuit elements are positively charged (it is assumed that the voltage is the same on each). Thus, no current will flow between any pair of circuit elements, and no pixels will be generated. In the second line of the table, circuit element No. 5 is negative, while the other elements are positive. Thus, current will flow between elements 3 and 5, and between elements 4 and 5. The latter statement is represented in the table by the notations "3/5" and "4/5". That is, two pixels are produced. Note that it is assumed that current can flow only between adjacent circuit elements; if two circuit elements are separated by more than one element's distance, the resistance of the cermet connecting these elements is at least twice as great, and it can be assumed that negligible current flows between these elements.

Because each circuit element can assume three possible conductive states, and because there are five elements per cell, there are $3^5$, or 243 different circuit configurations for the cell. However, Table 1 shows that the actual number of distinct pixel patterns, for the 5 pixel set, is 48. However, one must also consider the effect of the pixels to the left and the right of the given cell, and must be sure that there is no unintended pixel formed between the end-most circuit element of one array and the end-most circuit element of an adjacent array. Thus, if it is determined that a given polarity will cause an unwanted pixel to be formed between these elements, the polarity of the voltages applied to produce one of the pixels must be selected so that the polarity of adjacent circuit elements, from different cells, will be the same. Since every pixel is produced by heating a resistive element connected across two circuit elements, reversing the polarity of the voltages applied to both of these elements will leave the pixel unchanged. Thus, it is always possible to select the polarity of circuit elements to prevent unintended pixels from being formed between circuit elements of adjacent cells. The calculation of which circuit elements need to be changed in polarity can be done by a microprocessor, and is done in less time than is required for the thermal print head to print a line.

It is generally preferred that the current flowing through a given distance within the resistive element be the same throughout. One way of assuring such uniformity is to set the absolute voltage levels on each conductor according to the number pixels associated with that conductor.

Table 2 lists the 48 distinct combinations of pixels that can be generated with the five-element array discussed above. The top portion of Table 2 gives the number of resistive sites for the five-element array. Each resistive site comprises the portion of the resistive element located between two adjacent circuit elements, where a voltage is applied between these elements. Thus, Table 2 shows how many pixels can be generated where there are a given number of active resistive sites. The column at the top right of the table shows the number of primary and inverse combinations. A given resistive site can be energized by making one circuit element positive and the other negative, or by the inverse arrangement, where the first element is negative and the second is positive. Thus, the total number of ways of forming a given pixel is twice the number of primary combinations shown in the bottom portion of the table.

This bottom portion tabulates the primary pixel combinations that yield each different total number of active resistive sites.

For example, the seven ways in which there can be exactly one active resistive site (i.e. one region of the resistive material which is heated to produce a pixel) are shown as ½, ⅓, ⅔, 2/4, ¾, 3/5, and 4/5. Again, the latter notation means that current flows between circuit elements 1 and 2, or elements 1 and 3, etc.

In FIGS. 19a–j there are ten pixel configurations shown, all corresponding to the arrangement of circuit elements 1 through 5 of FIG. 19. The solid ellipses represent pixels of one color, and the dotted ellipses represent pixels of another color. For example, the solid ellipses could be blue, and the dotted ellipses could be yellow. FIG. 20a–j are similar in layout FIGS. 19a–j. In the case of FIGS. 20a–j the solid and dotted ellipses would represent two other colors, such as red and black. The pixel arrangements of FIGS. 19a–j and 20a–j can be superimposed to produce a four-color image.

FIGS. 19a–j and 20a–j show ten cells, each cell being produced by the two five circuit-element arrays. These cells are designated by the letters a through j. Pixel combinations shown in FIGS. 19a–j are generated from the circuit element combinations of Table 3. Pixel combinations shown in FIGS. 20a–j are generated from the circuit element combinations of Table 4.

The purpose of FIGS. 19a–j and 20a–j is to illustrate an example of the generation of ten grey scale levels, for each of four colors, and wherein the principal angles between pixels are different for each color. For example, FIG. 19c shows three pixels in the lower half of the cell, forming the blue 30% grey scale level, and three pixels in the upper half of the cell, forming the yellow 30% grey scale level. The screen angle can be thought of as zero or ninety degrees. FIG. 20c shows two pixels in the lower half of the cell, and one pixel in the upper half of the cell, forming the red 30% grey scale level, and two pixels in the upper half of the cell, and one in the lower half, forming the black 30% grey scale level. The screen angle can be thought of as plus or minus 45°. These angles clearly do not coincide with the angles present in FIG. 19c. The same kind of analysis applies to the other arrangements shown in these figures.

In FIGS. 19a-j and 20a-j in the arrangements representing the higher grey scale levels, not all of the possible pixels have been included for both colors. Black, for instance, in four-color printing, is generally not printed with a grey scale level greater than 70%.

In the example of FIGS. 19 and 20, if the print head is constructed using a two-layer, 600 line per inch array, each layer being capable of producing 300 pixels per inch, the arrangement of the 5×4 circuit element cell would produce a printing resolution of 150 lines per inch, along the x-axis, by 150 lines per inch, along the y-axis, based on a total resistive cermet width of the two layer circuit of 0.0033 inches.

It is common, in the prior art, to dither the thermal print head, as a means of enhancing the quality of the image. With the present invention, the need for dithering is reduced or eliminated, because the density of the circuit elements is so great. Thus, the present invention permits high resolution of images with a stationary print head. However, in particular cases, it may be desirable to dither the print head, in addition to using the techniques described herein.

Although the invention has been described with respect to several specific embodiments, it is understood that the invention can be varied. The materials into which the circuit elements are etched, whether dielectric or glass, can be varied, as can the type of conductive materials used. The arrangement and number of circuit layers can also be changed. The example given above of a pixel array for a thermal printer is only one of many possibilities, and can be varied almost without limit.

Also, the invention has been described with respect to the conductive cermet materials which are preferred in making the conductive circuit lines. The invention may also be practiced with other materials, not yet discovered, which are both conductive and capable of being embedded in an insulating substrate. These and other similar modifications are to be considered within the spirit and scope of the following claims.

What is claimed is:

1. A print head comprising at least one high-density electronic circuit, the circuit comprising a plurality of conductors, the conductors being formed in grooves in an electrically insulating substrate, each of said grooves having a width and a depth, the depth of each of said grooves being of the same order of magnitude as the width, the conductors being formed of a conductive cermet material, each of the conductors having a width which is less than about 0.005 inches, wherein there are spaces between adjacent conductors, the spaces having a width less than about 0.005 inches, the circuit extending over a total area exceeding about one square inch, the conductors having ends disposed near an image recording medium, wherein activation of selected conductors causes production of a picture element on said medium.

2. The print head of claim 1, wherein the print head is used in an electrostatic printer, and wherein each of said conductors comprises means for generating a single picture element on said medium.

3. The print head of claim 1, wherein the print head is used in a thermal printer, wherein the conductors are connected to a resistive element, wherein actuation of selected pairs of conductors causes current to flow through certain portions of the resistive element, wherein the resistive element produces picture elements on said medium.

4. The print head of claim 1, wherein the high-density circuit is formed in at least two electrically insulating layers formed in the substrate, each of said layers having a plurality of conductors having a density of at least about 150 lines per inch, the conductors of all of the layers being disposed near said image recording medium.

5. The print head of claim 4, wherein the conductors of each of said layers are staggered relative to the other layers.

6. A print head comprising at least one high-density electronic circuit, the circuit having a plurality of conductors having a density of at least about 200 lines per inch, the circuit being made by the method comprising the steps of:
   a) coating an electrically insulating substrate with a thin layer of material which can resist an etchant,
   b) coating the etchant-resistant layer of material with a photoresist,
   c) exposing the photoresist to light, the light being directed through a phototool comprising a pattern representing the desired electronic circuit,
   d) developing the photoresist to expose the etchant-resistive layer of material in those locations corresponding to elements of the desired circuit,
   e) removing the exposed portions of said etchant-resistive layer of material,
   f) etching into the substrate, in those locations where the etchant-resistive layer of material has been removed, to form grooves in the substrate, each of said grooves having a width and a depth, the depth of each of said grooves being of the same order of magnitude as the width,
   g) filling the grooves with a cermet material capable of becoming electrically conductive and capable of bonding to the substrate upon the application of heat, and
   h) heating the substrate to a temperature sufficient to bond the cermet material to the grooves in the substrate, and to make the cermet material electrically conductive, the cermet material forming the conductors of the circuit, wherein the conductors have ends disposed near an image recording medium, wherein activation of selected conductors causes production of a picture element on said medium.

7. The print head of claim 6, wherein the print head is used in an electrostatic printer, and wherein each of said conductors comprises means for generating a single picture element on said medium.

8. The print head of claim 6, wherein the print head is used in a thermal printer, wherein the conductors are connected to a resistive element, wherein actuation of selected pairs of conductors causes current to flow through certain portions of the resistive element, wherein the resistive element produces picture elements on said medium.

9. The print head of claim 6, wherein the high-density circuit is formed in at least two electrically insulating layers formed in the substrate, each of said layers having a plurality of conductors having a density of at least about 150 lines per inch, the conductors of all of the layers being disposed near said image recording medium.

10. The print head of claim 6, wherein the circuit lines of each of said layers are staggered relative to the other layers.

11. A print head comprising at least one high-density electronic circuit, the circuit comprising a plurality of conductors, the conductors being formed in grooves in an electrically insulating substrate, each of said grooves having a width and a depth, the depth of each of said grooves being of the same order of magnitude as the width, the conductors being formed of a conductive cermet material which substantially fills the grooves and is bonded to the grooves, each of the conductors having a width which is less than about 0.005 inches, wherein there are spaces between adjacent conductors, the spaces having a width less than about 0.005 inches, wherein the conductors have ends disposed near an image recording medium, wherein activation of selected conductors causes production of a picture element on said medium.

12. The print head of claim 11, wherein the print head is used in an electrostatic printer, and wherein each of said conductors comprises means for generating a single picture element on said medium.

13. The print head of claim 11, wherein the print head is used in a thermal printer, wherein the conductors are connected to a resistive element, wherein actuation of selected pairs of conductors causes current to flow through certain portions of the resistive element, wherein the resistive element produces picture elements on said medium.

14. The print head of claim 11, wherein the high-density circuit is formed in at least two electrically insulating layers formed in the substrate, each of said layers having a plurality of conductors having a density of at least about 150 lines per inch, the conductors of all of the layers being disposed near said image recording medium.

15. The print head of claim 14, wherein the circuit lines of each of said layers are staggered relative to the other layers.

* * * * *